United States Patent
El-Ghoroury et al.

(10) Patent No.: US 9,660,135 B2
(45) Date of Patent: May 23, 2017

(54) ENHANCED PERFORMANCE ACTIVE PIXEL ARRAY AND EPITAXIAL GROWTH METHOD FOR ACHIEVING THE SAME

(71) Applicant: Ostendo Technologies, Inc., Carlsbad, CA (US)

(72) Inventors: Hussein S. El-Ghoroury, Carlsbad, CA (US); Benjamin A. Haskell, Carlsbad, CA (US)

(73) Assignee: Ostendo Technologies, Inc., Carlsbad, CA (US)

(*) Notice: Subject to any disclaimer, the term of this patent is extended or adjusted under 35 U.S.C. 154(b) by 0 days.

(21) Appl. No.: 14/452,346

(22) Filed: Aug. 5, 2014

(65) Prior Publication Data
US 2014/0349427 A1 Nov. 27, 2014

Related U.S. Application Data

(63) Continuation of application No. PCT/US2014/029627, filed on Mar. 14, 2014.
(Continued)

(51) Int. Cl.
*H01L 21/00* (2006.01)
*H01L 33/00* (2010.01)
(Continued)

(52) U.S. Cl.
CPC ...... *H01L 33/0062* (2013.01); *H01L 21/0242* (2013.01); *H01L 21/0254* (2013.01); *H01L 21/02538* (2013.01); *H01L 21/02642* (2013.01); *H01L 21/02647* (2013.01); *H01L 27/156* (2013.01); *H01L 33/007* (2013.01);
(Continued)

(58) Field of Classification Search
CPC ............. H01L 21/0242; H01L 21/0254; H01L 21/02647; H01L 33/007; H01L 33/0066; H01L 33/16; H01L 33/08; H01L 27/156; H01L 21/02642; H01L 21/02538
See application file for complete search history.

(56) References Cited

U.S. PATENT DOCUMENTS 7,220,324 B2   5/2007   Baker et al.
7,623,560 B2   11/2009  El-Ghoroury et al.
(Continued)

OTHER PUBLICATIONS

"International Search Report and Written Opinion of the International Searching Authority Dated Jul. 29, 2014; International Application No. PCT/US2014/029627", (Jul. 29, 2014), 15 pp. total.
(Continued)

*Primary Examiner* — Richard Booth
(74) *Attorney, Agent, or Firm* — Blakely Sokoloff Taylor & Zafman LLP

(57) ABSTRACT

Methods are described to utilize relatively low cost substrates and processing methods to achieve enhanced emissive imager pixel performance via selective epitaxial growth. An emissive imaging array is coupled with one or more patterned compound semiconductor light emitting structures grown on a second patterned and selectively grown compound semiconductor template article. The proper design and execution of the patterning and epitaxial growth steps, coupled with alignment of the epitaxial structures with the imaging array, results in enhanced performance of the emissive imager. The increased luminous flux achieved enables use of such images for high brightness display and illumination applications.

40 Claims, 13 Drawing Sheets

Related U.S. Application Data

(60) Provisional application No. 61/800,076, filed on Mar. 15, 2013.

(51) Int. Cl.

| | | |
|---|---|---|
| *H01L 21/02* | (2006.01) | |
| *H01L 27/15* | (2006.01) | |
| *H01L 33/08* | (2010.01) | |
| *H01S 5/026* | (2006.01) | |
| *H01S 5/30* | (2006.01) | |
| *H01L 33/16* | (2010.01) | |

(52) U.S. Cl.
CPC ...... *H01L 33/0066* (2013.01); *H01L 33/0075* (2013.01); *H01L 33/08* (2013.01); *H01S 5/026* (2013.01); *H01S 5/3013* (2013.01); *H01L 33/16* (2013.01); *H01L 2933/0025* (2013.01)

(56) References Cited

U.S. PATENT DOCUMENTS

| | | | |
|---|---|---|---|
| 7,767,479 | B2 | 8/2010 | El-Ghoroury et al. |
| 7,829,902 | B2 | 11/2010 | El-Ghoroury et al. |
| 8,049,231 | B2 | 11/2011 | El-Ghoroury et al. |
| 8,243,770 | B2 | 8/2012 | El-Ghoroury et al. |
| 8,567,960 | B2 | 10/2013 | El-Ghoroury et al. |
| 8,629,065 | B2 | 1/2014 | Spiberg et al. |
| 8,673,074 | B2 | 3/2014 | Usikov et al. |
| 2006/0205199 | A1 | 9/2006 | Baker et al. |
| 2008/0224190 | A1 | 9/2008 | Lee et al. |
| 2009/0086170 | A1 | 4/2009 | El-Ghoroury et al. |
| 2009/0278998 | A1 | 11/2009 | El-Ghoroury et al. |
| 2010/0003777 | A1 | 1/2010 | El-Ghoroury et al. |
| 2010/0012948 | A1 | 1/2010 | Usikov et al. |
| 2010/0066921 | A1 | 3/2010 | El-Ghoroury et al. |
| 2010/0207205 | A1 | 8/2010 | Grebs et al. |
| 2010/0220042 | A1 | 9/2010 | El-Ghoroury et al. |
| 2011/0095291 | A1 | 4/2011 | Quitoriano |
| 2011/0108954 | A1 | 5/2011 | Spiberg et al. |
| 2011/0278585 | A1 | 11/2011 | Haskell et al. |
| 2012/0033113 | A1 | 2/2012 | El-Ghoroury et al. |
| 2012/0288995 | A1 | 11/2012 | El-Ghoroury et al. |

OTHER PUBLICATIONS

Craven, M. D., et al., "Threading dislocation reduction via laterally overgrown nonpolar ($11\bar{2}0$) *a*-plane GaN", *Applied Physics Letters*, vol. 81, No. 7, (Aug. 12, 2002), pp. 1201-1203.

Gale, R. P., et al., "Lateral epitaxial overgrowth of GaAs by organometallic chemical vapor deposition", *Applied Physics Letters*, vol. 41, No. 6, (Sep. 15, 1982), pp. 545-547.

Grandjean, N., et al., "Built-in electric-field effects in wurtzite AlGaN/GaN quantum wells", *Journal of Applied Physics*, vol. 86, No. 7, (Oct. 1, 1999), pp. 3714-3720.

Haskell, B. A., et al., "Defect reduction in ($11\bar{2}0$) *a*-plane gallium nitride via lateral epitaxial overgrowth by hydride vapor-phase epitaxy", *Applied Physics Letters*, vol. 83, No. 4, (Jul. 28, 2003), pp. 644-646.

Haskell, B. A., et al., "Defect reducton in ($1\bar{1}00$) *m*-plane gallium nitride via lateral epitaxial overgrowth by hydride vapor phase epitaxy", *Applied Physics Letters*, vol. 86, (2005), pp. 111917-01 to 111917-03.

Haskell, B. A., et al., "Structural and morphological characteristics of planar ($11\bar{2}0$) *a*-plane gallium nitride grown by hydride vapor phase epitaxy", *Applied Physics Letters*, vol. 83, No. 8, (Aug. 25, 2003), pp. 1554-1556.

Imer, Bilge M., et al., "Improved quality ($11\bar{2}0$) *a*-plane GaN with sidewall lateral epitaxial overgrowth", *Applied Physics Letters*, vol. 88, (2006), pp. 061908-01 to 061908-03.

Kapolnek, D., et al., "Anisotropic epitaxial lateral growth in GaN selective area epitaxy", *Applied Physics Letters*, vol. 71, No. 9, (Sep. 1, 1997), pp. 1204-1206.

Northrup, John E., "GaN and InGaN($11\underline{2}2$) surfaces: Group-III adlayers and indium incorporation", *Applied Physics Letters*, No. 95, (2009), pp. 133107-1 to 133107-3.

Strittmatter, Andre, et al., "Semi-polar nitride surfaces and heterostructures", *Phys. Status Solidi B* 248, No. 3, (2011), pp. 561-573.

Marwah, Kshitij, et al., "Compressive Light Field Photography using Overcomplete Dictionaries and Optimized Projections", *Proc. of SIGGRAPH 2013 (ACM Transactions on Graphics*, 32, 4), (2013), 12 pp. total.

(a) Schematic of c-plane III-nitride crystal orientation (b) Schematic of nonpolar a-plane III-nitride crystal orientation (c) Schematic of nonpolar m-plane III-nitride crystal orientation {1011} Plane　　　{1013} Plane　　　{1122} Plane Illustration of several GaN planes Polar　　　Non-Polar　　　Semi-Polar Illustration of several relevant crystal planes in the III-nitride crystal structure Illustration of an embodiment of a selective LEO mask as applied to a compound semiconductor template for an emissive imager pixel array.

Illustration of a lateral overgrowth pattern of stripes that would provide benefit for an emissive imager array Illustration of QPI Epitaxial Lateral Overgrowth Mask Pattern with Staggered Windows (a) Rectangular Window Area  (b) Oval Window Area
Illustration of example window shapes for a mask

ENHANCED PERFORMANCE ACTIVE PIXEL ARRAY AND EPITAXIAL GROWTH METHOD FOR ACHIEVING THE SAME

CROSS-REFERENCE TO RELATED APPLICATIONS

This application is a continuation of International Application No. PCT/US2014/029627 filed Mar. 14, 2014 which claims the benefit of U.S. Provisional Patent Application No. 61/800,076 filed Mar. 15, 2013.

BACKGROUND OF THE INVENTION

1. Field of the Invention

The present invention relates to emissive imager devices comprising monolithic semiconductor arrays of multicolor light emitters that can be used as an image or light sources for display, projection or illumination applications. The invention further relates to epitaxial growth of compound semiconductor layers for use in the emissive imager, and methods to improve the quality and performance thereof. The invention further relates to the epitaxial growth of compound semiconductor template layers having periodic arrays of reduced defect density suitable for production of superior performance light emitting devices.

2. Prior Art

References Cited

[1] U.S. Pat. No. 7,623,560, Quantum Photonic Imagers and Methods of Fabrication Thereof, EI-Ghoroury et al, Nov. 24, 2009

[2] U.S. Pat. No. 7,767,479, Quantum Photonic Imagers and Methods of Fabrication Thereof, EI-Ghoroury et al, Aug. 3, 2010

[3] U.S. Pat. No. 7,829,902, Quantum Photonic Imagers and Methods of Fabrication Thereof, EI-Ghoroury et al, Nov. 9, 2010

[4] U.S. Pat. No. 8,049,231, Quantum Photonic Imagers and

Methods of Fabrication Thereof, EI-Ghoroury et al, Nov. 1, 2011

[5] U.S. Pat. No. 8,243,770, Quantum Photonic Imagers and Methods of Fabrication Thereof, EI-Ghoroury et al, Aug. 14, 2012

[6] U.S. Pat. No. 8,567,960, Quantum Photonic Imagers and Methods of Fabrication Thereof, EI-Ghoroury et al, Oct. 29, 2013

[7] U.S. Pat. No. 7,220,324, Techniques for the Growth of Semi-Polar Gallium Nitride, Baker et al, May 22, 2007

[8] Grandjean et al., J. Appl. Phys. 86 (7) 3714 (1999). [C-PLANE POLARIZATION]

[9] Northrup, Appl. Phys. Lett. 95, 133107 (2009). [{11.2} THEORY]

[10] Gale et al., Appl Phys. Lett. 41 (6) 545 (1982). [GaAs LEO]

[11] Kapolnek et al., Appl. Phys. Lett. 71 (9) 1204 (1997) [C-GaN LEO]

[12] Craven et al., Appl. Phys. Lett. 81 (7) 1201 (2002) [a-GaN LEO MOCVD]

[13] Haskell et al., Appl. Phys. Lett. 83 (4) 644 (2003) [a-GaN LEO HVPE]

[14] Haskell et al., Appl. Phys. Lett. 83 (8) 1554 (2003) [a-GaN HVPE]

[15] Haskell et al., Appl. Phys. Lett. 86, 111917 (2005) [m-GaN LEO HVPE]

[16] Imer et al., Appl. Phys. Lett. 88, 061908 (2006). [NONPOLAR SLEO]

[17] Strittmatter et al, Phys. Status Solidi B248, No. 3, 561-573 (2011)

The advent of efficient direct bandgap compound semiconductor materials and devices has given rise to a multitude of novel products, ranging from simple single color, point source light emitting diodes (LEDs) for indicator applications; to energy efficient multi-color or color-mixed LEDs for general illumination and display applications; to active digital display technology based on passive or emissive imagers. Of particular interest to the field of this invention are compound semiconductor templates, layers, and devices that can be utilized in emissive imagers and solid state light engines. Emissive imagers and light engines face strong competition from established low-cost technologies, effective means to improve their performance while significantly reducing their cost is crucial for these technologies future.

A novel emissive imager was disclosed in Ref [1-6], incorporated by reference herein, which relies on the use of bonded III/V compound semiconductor light emitting structures to efficiently generate light. Such a bonded III/V compound semiconductor emissive imager is illustrated in FIG. 1.

While the principal application of such emissive imagers is as engines for a projection display, the same devices could be utilized for illumination applications, including but not limited to general solid state lighting, adjustable directional lighting, and color-tunable specialty lighting. However, such lighting applications depend on high luminous flux emanating from the imager's pixel array. Similarly, the performance characteristics of the emissive imager in projection display applications significantly depends on the luminous flux the imager is capable of generating. It is therefore desirable to create an emissive imager that maximizes the luminous intensity emitted from each light generating element or pixel.

Practically speaking, luminous flux of III/V compound semiconductor light emitters is intimately tied to the external quantum efficiency of the photon generation process within the semiconductor device. Inefficient light emitters convert electric current to heat via non-radiative recombination, which further degrades emitter efficiency and risks thermal damage to the light emitter and/or thermally coupled electronics and optics. It is therefore preferable to utilize a high-efficiency semiconductor light source when fabricating an emissive imager.

Red light emitting diodes and laser diodes are predominantly fabricated using III/V compound semiconductors of the (Al, In, Ga)(As, P) (III-arsenide-phosphide) system. In contrast, the (Al, In, Ga)N(III-nitride) material system is suitable for fabrication of visible light diodes (LEDs and laser) spanning the entire visible spectrum, with current commercial emphasis placed on blue, green, and white emitters.

The efficiency of a compound III/V semiconductor light emitter, whether based on the III-arsenide-phosphide or III-nitride system, is highly dependent on the density of microstructural crystalline defects in the emitter material. The most common of such microstructural crystalline defects are known as threading dislocations, as described in U.S. Ser. No. 09/247,413 and Ref [14] for III-arsenides-phosphides and III-nitrides, respectively. Various III/V compound semiconductor materials tolerate the presence of such microstructural crystalline defects differently. However, across all materials systems, it can be broadly stated that, within certain defect density ranges, the radiative recombination efficiency of the III/V compound semiconductor material increases as microstructural crystalline defect density decreases.

III-arsenide-phosphide semiconductor light emitters have been historically grown via metalorganic chemical vapor deposition (MOCVD), molecular beam epitaxy (MBE), or hydride vapor phase epitaxy (HVPE). These growth techniques are utilized to homoepitaxially deposit layers of III-arsenide-phosphide material upon either GaAs or InP substrates. These homoepitaxial substrates exhibit low threading dislocation and stacking fault densities. In some instances, however, it may be desirable to grow III-arsenide-phosphide semiconductor light emitters on alternate substrates via heteroepitaxy. Such heteroepitaxial growth may provide advantages for integration of the compound semiconductor layers with conventional electronics structures based on silicon or optical structures, for example. A significant drawback to such heteroepitaxy, however, is the tendency for elevated densities of threading dislocations to form.

III-nitride semiconductor light emitters have historically been grown heteroepitaxially due to the limited availability of native GaN, AlN, or InN substrates. Sapphire ($Al_2O_3$), silicon carbide (SiC), spinel ($Mg_2AlO_4$), and silicon (Si) have been most commonly utilized for such heteroepitaxial growth. Typical III-nitride layers heteroepitaxially grown upon these layers commonly exhibit extremely high threading dislocations densities, on the order of $10^8$ to $10^{10}$ dislocations per square centimeter. Such high dislocation densities dramatically reduce the radiative recombination efficiency of III-nitride light emitters and increase heat generation, making such light emitters less desirable for illumination and display applications.

With respect to würtzite III-nitride growth, it is necessary to further specify crystal orientation when designing and executing epitaxial growth processes. Referring to FIG. 2(a), the majority of III-nitride films, templates, and devices are presently grown along the polar c-axis. The surface of such polar III-nitride material is referred to as the "c-plane." Such surfaces exhibit a hexagonal array of group III atoms in the case of metal-polar termination, or a hexagonal array of nitrogen atoms in the case of "N-polar" termination. III-nitride devices, such as LEDs and laser diodes, are most commonly, though not exclusively, fabricated on the metal-terminated c-plane, most commonly the Ga-polar c-plane of GaN substrates and templates. Devices, templates, and substrates having a primary surface orientation parallel to the III-nitride c-plane will be collectively referred to herein as "polar" or "c-plane" nitrides, substrates, templates, or devices, as appropriate. Using common Miller-Bravais {hkil} index notation, the polar c-planes can be collectively described by the indices {0001}. More specifically, the metal-terminated c-plane is referred to as the (0001) plane while the nitrogen-terminate c-plane is referred to as the (000$\bar{1}$) plane. Alternate notation for these planes that recognizes the redundancy of the h, k, and i indices is (00.1) and (00.$\bar{1}$) for the metal-terminated and N-terminated c-planes, respectively.

While much progress has been made in the development of polar nitride devices, such polar nitrides suffer from significant built-in polarization fields that degrade efficiency and performance (see Grandjean et al., for example). Recently attempts have been made to grow III-nitrides on alternate crystal orientations to avoid the deleterious polarization effects of such polar nitrides Ref [16]. One class of such alternate orientations is referred to as "non-polar" III-nitrides. Generally speaking, any crystal plane in the würtzite III-nitride crystal system having indices {hki0}/{hk.0} can be described as a non-polar plane. The two most common non-polar plane orientations are the {11.0} a-planes and {10.0} m-planes, as illustrated in FIGS. 2(b) and 2(c), respectively. In the case of all non-polar III-nitride planes, the polar c-axis lies approximately parallel to the surface of the substrate, template, or device film. Polarization fields still exist in such non-polar III-nitrides; however, their deleterious influence is minimized for vertical devices grown on such non-polar planes. Waltereit et al., Craven et al., and Haskell et al. provided details regarding initial demonstrations of non-polar GaN growth by MBE, MOCVD, and HVPE, respectively; these reports are incorporated by reference herein.

Semi-polar planes represent a third class of crystal orientations that is relevant for the fabrication of III-nitrides, the growth of which were described by Baker et al in U.S. Pat. No. 7,220,324. A semi-polar plane is any crystal plane having at least two non-zero h, k, and/or i Miller-Bravais indices and a non-zero/Miller-Bravais index. Some common examples of semi-polar planes are the {30.1}, {20.1}, {10.1}, {10.2}, {10.3}, and {11.2} families of planes. FIG. 3 illustrates several such planes. Semipolar planes exhibit reduced polarization fields perpendicular to the major substrate/template/film surface compared to polar planes. As described by Northrup, which is incorporated by reference herein, the piezoelectric and spontaneous polarization components of the total polarization partially or completely cancel each other depending on the composition of layers grown on said semi-polar planes.

In order to improve the performance of both III-arsenide-phosphide and III-nitride compound semiconductor light emitters, lateral epitaxial overgrowth (LEO) methods have been demonstrated for these materials systems. In such LEO methods, the semiconductor material is grown selectively in lateral (parallel to the plane of the substrate) directions or inclined (neither parallel nor perpendicular to the plane of the substrate) directions rather than vertical (perpendicular to the plane of the substrate) directions. Several examples of such LEO methods are illustrated in FIG. 4. Commonly, LEO techniques utilize application of a mask material to either the substrate or a thin film of the desired compound semiconductor material upon said substrate (a template). The mask is selected from a variety of materials including, but not limited to, silicon oxide ($SiO_x$), silicon nitride ($SiN_x$), titanium nitride (TiN), and a variety of compounds and metals. The critical feature of the mask material is that it must provide selectivity for growth of the compound semiconductor material: nucleation of the semiconductor on the mask is thermodynamically or kinetically unfavorable compared to growth on the semiconductor itself.

Depending on the semiconductor material to be grown, the orientation of the heteroepitaxial substrate and/or template layers upon said substrate, the orientation of the mask, the epitaxial growth method utilized, and the epitaxial growth process parameters utilized, LEO techniques are theoretically capable of reducing microstructural defect densities by several orders of magnitude compared to typical heteroepitaxial grown material. Theoretically, LEO techniques coupled with heteroepitaxial growth could provide significant advantages for compound semiconductor LED fabrication processes versus those which are based upon thin film processing on carrier wafers. LEO processes have been demonstrated for III-arsenide-phosphides by Gale et al, for example. Kapolnek et al. demonstrated c-plane III-nitride LEO growth in various mask orientations. Craven et al. demonstrates non-polar a-plane III-nitride LEO growth via MOCVD. And Haskell et al. demonstrated both a-plane and m-plane III-nitride LEO growth via HVPE.

Emissive imagers such as the Quantum Photonic Imager Ref [1-6], would benefit significantly from reduced defect density compound semiconductor substrate or template material as peak efficacy of such imagers would increase compared to those fabricated via conventional heteroepitaxial growth. Such reduced defect density material could theoretically be achieved with LEO-type processes. However, mask-based LEO techniques are not widely utilized in commercial LED or laser diode fabrication because they are costly and difficult to implement, generally provide for incomplete or inhomogeneous defect reduction, and can increase strain within the semiconductor material layers compared to non-LEO heteroepitaxially grown material.

Emissive imagers would further benefit from the availability of large-area non-polar and/or semi-polar III-nitride substrates and templates possessing low microstructural defect densities. Such substrates and/or templates would enable increased luminous flux emissive imagers to be fabricated cost-effectively. However, at present large area, low-defect density non-polar and semi-polar III-nitride substrates and templates are not widely available.

It is clear that there is a need for reduced defect density compound semiconductor material that is compatible with the fabrication of emissive imagers. In particular, there is a need for templates that provide low-defect densities in active regions of emissive imager pixels. It is further clear that there is a need for non-polar and semi-polar III-nitride templates and/or substrates that provide low defect densities in active regions of emissive imager pixels. Additional objectives, advantages, and uses of the invention described herein will become apparent from the following detailed description of the preferred embodiments thereof that proceeds with reference to the accompanying drawings.

BRIEF DESCRIPTION OF THE DRAWINGS

In the following description, like drawing reference numerals are used for the like elements, even in different drawings. The matters defined in the description, such as detailed construction and elements, are provided to assist in a comprehensive understanding of the exemplary embodiments. However, the present invention can be practiced without those specifically defined matters. Also, well-known functions or constructions are not described in detail, since they would obscure the invention with unnecessary detail. In order to understand the invention and to see how it may be carried out in practice, a few embodiments of it will now be described, by way of non-limiting example only, with reference to accompanying drawings, in which.

DETAILED DESCRIPTION OF THE PREFERRED EMBODIMENTS

Figure 1:
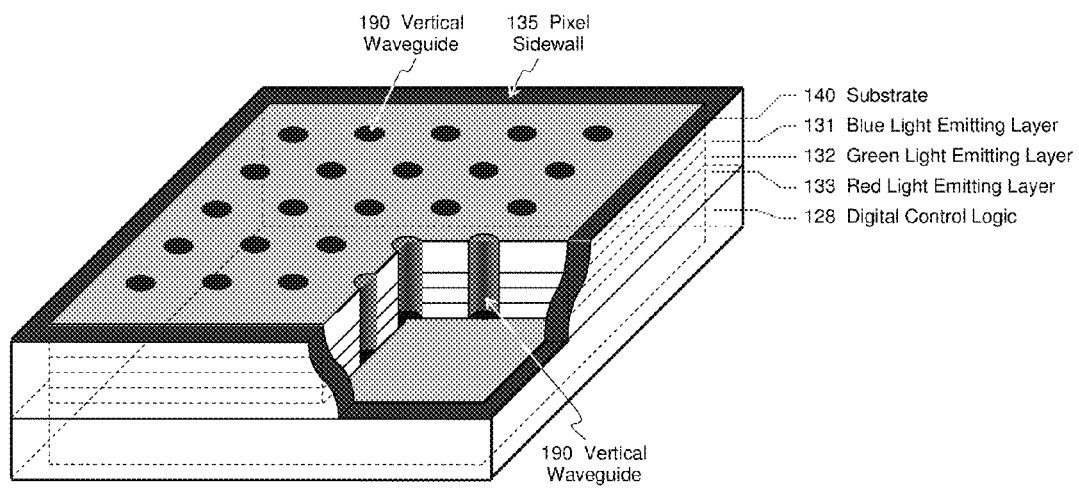
FIG. 1 illustrates a isometric view of a solid state light based Quantum Photonic Imager emissive pixel.
Figure 2:
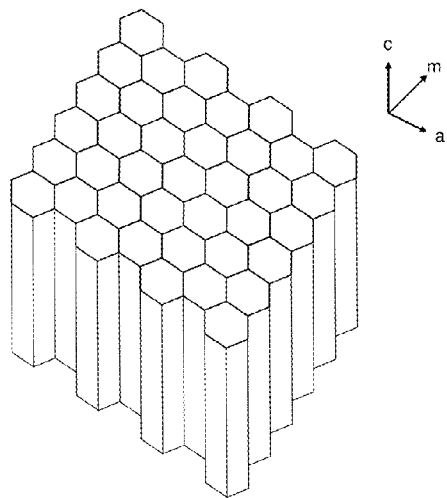
FIG. 2 illustrates schematic representations of III-nitride (a) polar c-plane structures, (b) non-polar a-plane structures, and (c) non-polar m-plane structures.
Figure 2:
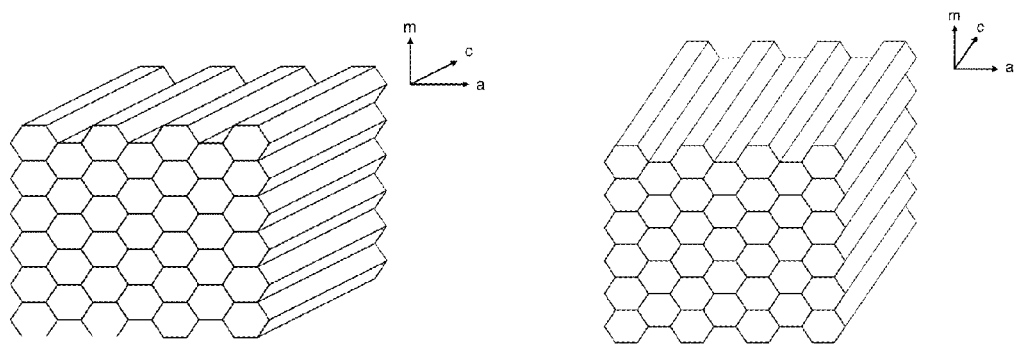
Figure 3:
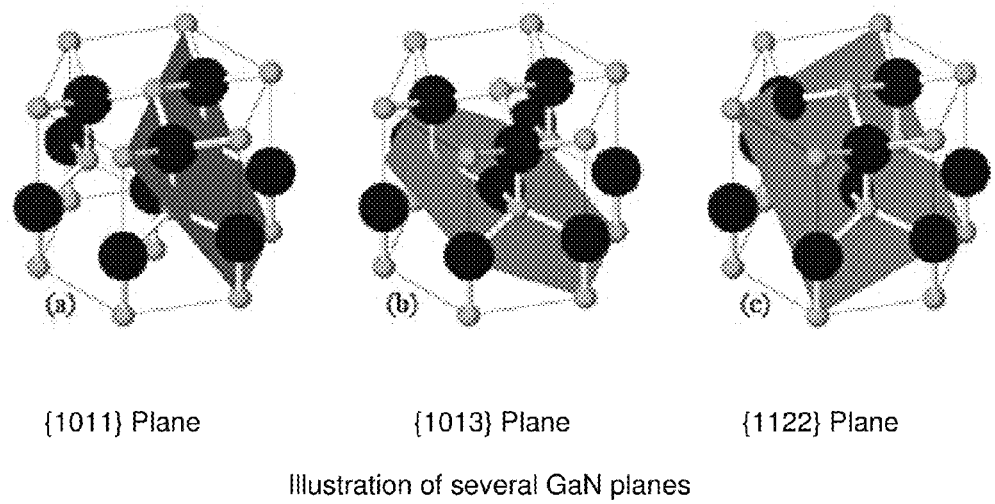
FIG. 3 illustrates selected semi-polar planes in the III-nitride material system.
Figure 4:
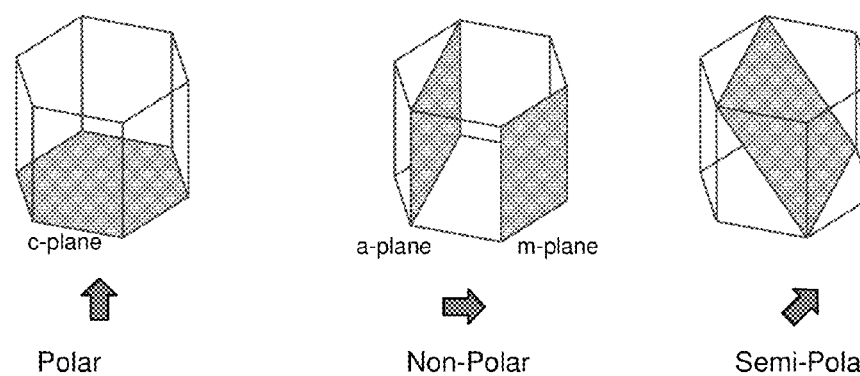
FIG. 4 illustrates several III-nitride LEO geometries reported in the prior art for c-plane, non-polar planes, and semi-polar planes.

A new class of emissive micro-scale pixel array devices has been recently introduced Ref [1-6]. These devices are solid state light (SSL) based and feature high brightness, very fast light multi-color intensity and spatial modulation capabilities in a very small single device size that includes all the drive circuitry. The SSL light emitting pixels of one such a device may be either a light emitting diode (LED) or laser diode (LD) whose on-off state is controlled by the drive circuitry contained within a CMOS chip (or device) upon which the emissive micro-scale pixel array is bonded. The size of the pixels comprising the emissive array of such devices would typically be in the range of approximately 5-20 micron with the typical emissive surface area of the device being in the range of approximately 15-150 square millimeter. The pixels within the emissive micro-scale pixel array device are individually addressable spatially, chromatically and temporally, typically through the drive circuitry of its CMOS chip. One example of such devices are the QPI devices (see Ref [1-6]), referred to in the exemplary embodiments described below. However it is to be understood that the QPI device is merely an example of the types of devices that may be used in the present invention. Thus in the description to follow, references to a QPI device are to be understood to be for purposes of specificity in the embodiments disclosed, and not for any limitation of the present invention.

The present invention satisfies a need for selective reduced defect density compound semiconductor templates and/or substrates for emissive imager applications. The invention is further compatible with the fabrication of locally low-defect density non-polar and semi-polar III-nitride templates and/or substrates for emissive imager applications. The invention further provides for an emissive imager that leverages the unique characteristics of selectively reduced defect density compound semiconductor templates and/or substrates.

References in the following detailed description of the present invention to "one embodiment" or "an embodiment" mean that a particular feature, structure, or characteristic described in connection with the embodiment is included in at least one embodiment of the invention. The appearances of "in one embodiment" in various places in this detailed description are not necessarily all referring to the same embodiment. Further, while the detailed descriptions provided herein elucidate several preferred embodiments, one skilled in the art will recognize that variations of such preferred embodiments and alternate embodiments may be created that possess the fundamental characteristics of the invention are lie within the scope of the invention.

Throughout the background discussion, references were made to III-arsenide-phosphide materials and III-nitride materials. For reasons of simplicity and clarity, the detailed description will utilize examples based on III-nitride materials only. However, one skilled in the art will recognize that the embodiments describes may be readily adapted to III-arsenide materials, and that such adaptations constitute alternate embodiments of this same invention.

The background further referenced emissive imagers in general. In the detailed descriptions of the invention provided herein, a Quantum Photonic Imager (QPI) as described in Ref [1-6] will be utilized as an example of an emissive imager. It shall be understood that references to QPI herein shall generally describe any emissive single-color or multi-color digital image forming device that utilizes light emitted by III-arsenide-phosphide and/or III-nitride light emitting structures as opposed to a specific emissive imager such as the QPI.

Reference will be made herein to a semiconductor light emitting layer. Emissive imagers may contain one or more such light emitting layers. The present invention can be implemented on one or more such light emitting layers within the emissive imager structure. Further, the invention need not be applied to all such light emitting layers in the imager to be effective. For example, the invention could be applied to blue-and green-emitting compound semiconductor light emitting layers but not to red-emitting layers within an emissive imager while yielding significant performance improvements. It shall be understood that reference herein to a single light emitting layer can be generalized to apply to any or all semiconductor light emitting layers within an emissive imager without narrowing the scope of the invention.

The detailed description herein will utilize gallium nitride (GaN) by way of example of III-nitride materials. Such discussion of GaN is made for clarity and is not intended to limit the applicability of the invention to GaN alone. One skilled in the art will recognize that embodiments provided herein that include references to GaN can be implemented using alternate compositions of III-nitride material without fundamentally deviating from the scope of the present invention.

The QPI can be generalized as a silicon-based control layer bonded to a stack of one or more direct-band-gap compound semiconductor light emitting layers that have been patterned to form a multiplicity of dies on a single wafer, with each die comprising a multiplicity of light emitting pixel diodes. Photons generated in the light emitting layers are emitted from the top surface of multi layer stack principally through waveguides that partially or completely penetrate the light emitting layer(s). Photons escape the light emitting layers of the die through the free surfaces of the pixel array forming one die, preferably the top surface of the die, and less preferably through the sidewalls of the pixel die which are reflective to ensure maximum photon emission through the top surface of the die. For the purposes of the present invention, two generalized embodiments will be illustrated: a first embodiment in which the die excludes waveguides and light is emitted directly from the die surfaces, and a second embodiment in which light is emitted via vertical waveguides principally. One skilled in the art will recognize that most practical emissive imagers could be made to emit light using a hybrid of these two generalized embodiments.

Figure 5A:
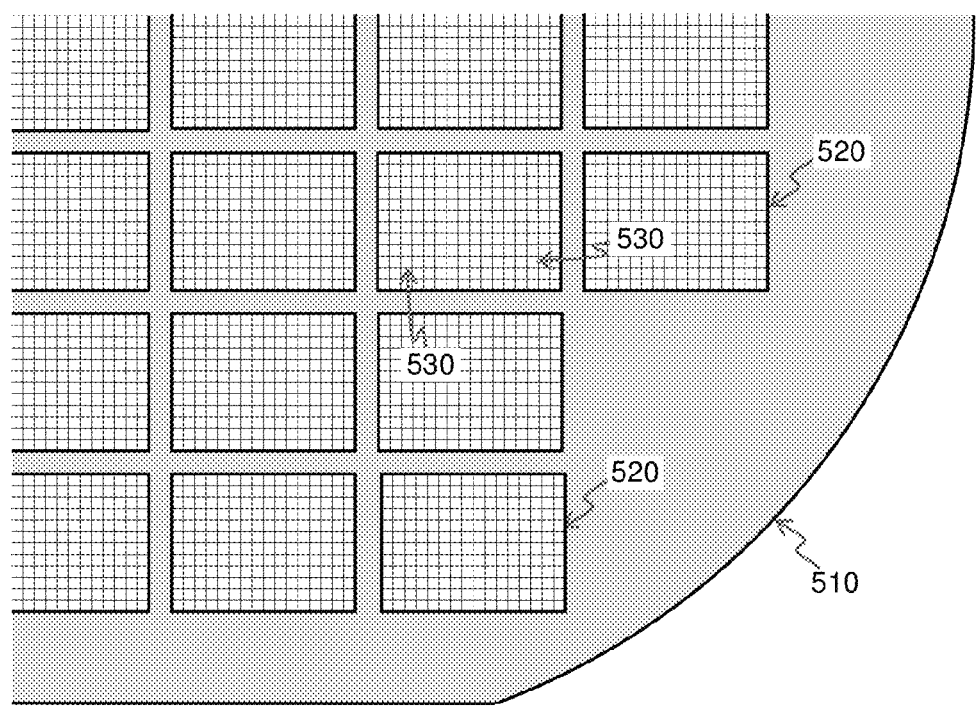
FIG. 5a is a plan view illustration of a device die a pixel array pattern on a wafer.
Figure 5B:
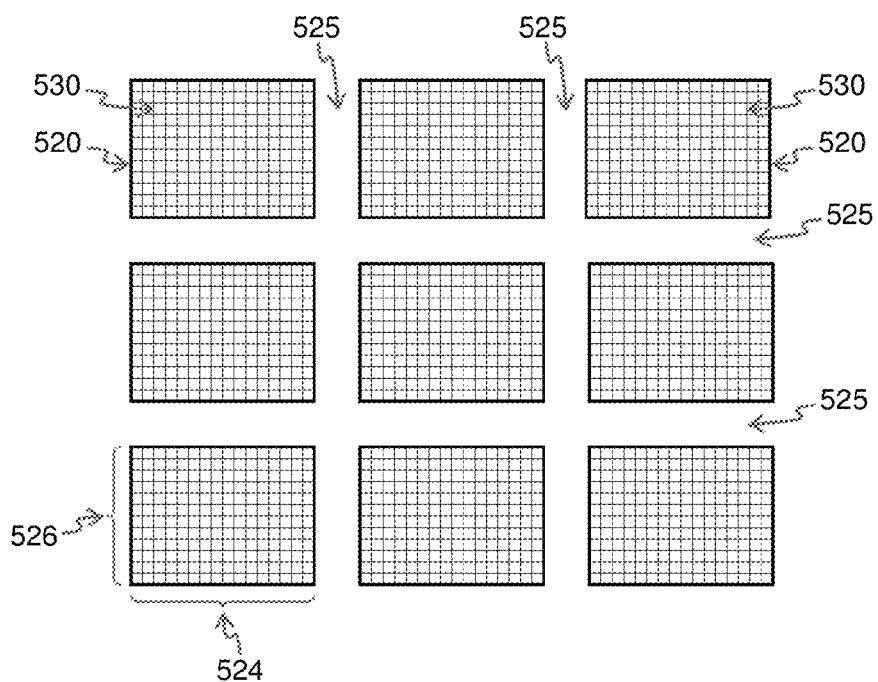
FIG. 5b illustrates the pattern of device dies each incorporating its constituent pixel array.

A critical feature of the present invention is the division of the light emitting layer into discrete dies each comprising multiplicity of pixels whereby each die and each pixel would have characteristic shape and dimensions. FIG. 5a illustrates a generic die array pattern of an emissive imager semiconductor wafer for illustrative purposes. Referring to FIG. 5a, the compound semiconductor light emitting layers of the emissive imager would typically be processed as a semiconductor wafer 510 which would comprise an array of dies 520 whereby the compound semiconductor material within each die 520 area would, after a specific semiconductor processing flow Ref [1-6], become an array of the light emitting diode pixels 530. Each die 520 and each pixel 530 within the die 520 would have a characteristic shape that can be described by dimensions. FIG. 5b is an expanded view illustration of few dies 520 within the die array comprising the semiconductor wafer 510. As illustrated in FIG. 5b, adjacent dies 520 are separated by the gap 525. In the illustration of FIG. 5b, a rectangular die 520 having lateral dimensions represented by blocks 524 and 526 have been provided comprising square shape pixels 530. However, the dies need not be rectangular or separated by equal gaps 525 and the pixels need not to be square to be compatible with the present invention. Further, all of the dies 520 upon the semiconductor wafer 510 need not possess identical shapes. For example, in one embodiment it would be preferable for die 520 near the edges of the semiconductor wafer 510 to possess different geometry from those die 520 proximal to the center of the semiconductor wafer 510 of the emissive imager. However, for the successful practice of the present invention, the shapes of the dies 520 and their constituent pixels 530 must be predictable within acceptable manufacturing tolerances. It should be noted that the pixels 530 within a die 520 would constitute the emissive pixel diodes of the emissive imager and the die 520 constitute the emissive aperture of the emissive imager device. The gaps 525 area between the dies 520 would typically be allocated for the contact pads and the scribe areas of the emissive imager dies. Therefore, the gaps 525 area between the dies 520 need not incorporate the high quality compound semiconductor material typically needed for the light emitting pixel diodes that would contribute light to the emissive aperture of the emissive imager.

The illustration provided in FIG. 5a shows multiple die 520 on the semiconductor wafer 510 separated by street 525 (in FIG. 5b), as is common practice in semiconductor processing. However, the invention is compatible with a semiconductor wafer configuration in which only one die is patterned on each wafer as well. Though only a single die is present on the wafer, such a die will still have a street associated with it as every semiconductor wafer, when subjected to epitaxy or processing steps, will experience some edge exclusion zone in which device properties may be inconsistent. Even if such exclusion zones are not physically removed from the semiconductor wafer, they constitute inactive areas that may be utilized in the practice of the invention.

Figure 5C:
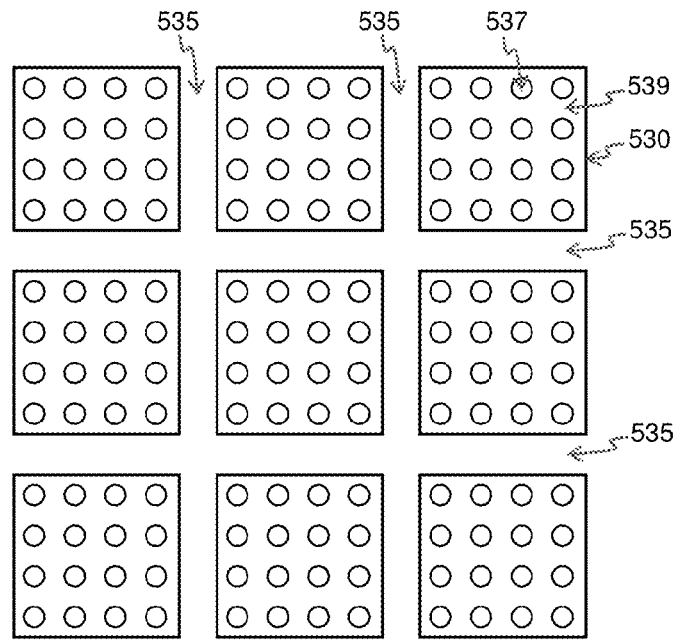
FIG. 5c illustrates the pattern of pixels within the pixel array each incorporating its constituent pixel waveguides.

FIG. 5c is a further expanded view illustrating a few of the pixels 530 within a die 520 of the array of dies illustrated in FIG. 5a and FIG. 5b. As illustrated in FIG. 5c, the pixels 530 within an emissive imager die 520 would be separated by the gaps 535 which are used to incorporate pixels' sidewalls that optically and electrically isolate the pixels 530 from each other Ref [1-6]. The compound semiconductor material within the gaps' 535 separating the pixels 530 areas would typically be etched away and filled with dielectric metal materials that facilitate the optical and electrical separation between the pixels 530. Also illustrated in FIG. 5c are the multiplicity of vertical waveguide apertures 537 which are typically used to extract and guide the light generated within the interior active region 539 of the pixel 530 to be emitted vertically from the top surface of the pixel 530. Note that the waveguides denoted by block 537 in FIG. 5c are equivalent to the waveguides illustrated by block 190 of FIG. 1. The compound semiconductor material within the pixels' 530 waveguide aperture 537 areas would typically be etched away and filled with dielectric material that facilitate the wave guiding effect of the pixels' vertical waveguides, Ref [1-6]. Therefore, neither the gaps 535 between the pixels 530 nor the pixels' waveguide aperture 537 areas need to incorporate the high quality compound semiconductor material typically needed for the light emitting pixel diodes active region that would contribute light to the emissive aperture of the emissive imager.

The active area of the compound semiconductor light emitting layer is therefore coincident with or contained within the pixels' 530 active regions 539. The pixels' active regions 539 can be coincident with the entire pixel area, or can exclude areas within the pixel bounds, such as waveguide apertures 537. Microstructural defects existing within the pixels' 530 active regions 539 of the pixel array within the die area 520 may decrease radiative recombination efficiency of the light emitting layer, and subsequently the pixel array, of the emissive imager device. As explained earlier, the portion of the compound semiconductor light emitting layer material between die, denoted by block 525, would be partially removed during die slice and dice step and the remaining portion of such gaps 525 areas would be used for the layout of the emissive imager contact pads. Furthermore, the gaps 535 between the pixels 530 and the pixels' waveguide aperture 537 areas would also be removed during the formation of the die 520 pixels' 530 array. Therefore, the presence of microstructural defects in the portions of the compound semiconductor light emitting layer that will represent street 525 and inter-pixel gaps 535 as well as waveguide aperture 537 areas does not necessarily negatively impact or decrease the light emission from the emissive imager device.

In designing an emissive imager, there may exist additional regions not used for inter-die street 525, inter-pixel gaps 535 or waveguides aperture areas 537 that will not be electrically and optically active in the functional imager device. Such areas could include, but not be limited to, vias for electrical contacts to underlying digital electronic or photonic layers. Areas that will be removed from the compound semiconductor light emitting layer during formation of the emissive imager structure can generally be allowed to contain elevated microstructural defect densities relative to the active areas of the semiconductor light emitting layer, which should contain a minimal density of said defects.

Figure 6A:
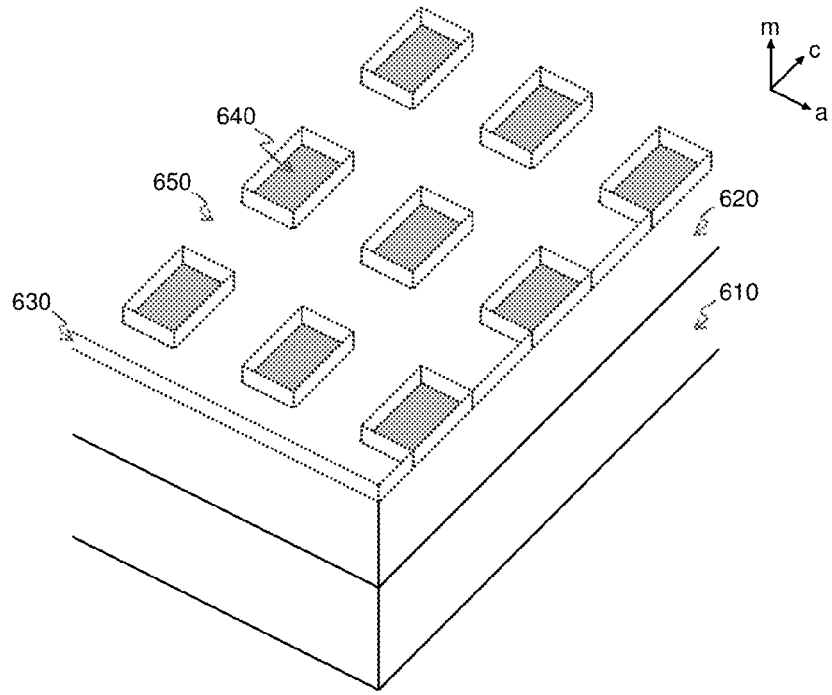
FIG. 6a illustrates an embodiment of a lateral over-growth mask as applied to a compound semiconductor template for an emissive imager pixel array.
Figure 7A:
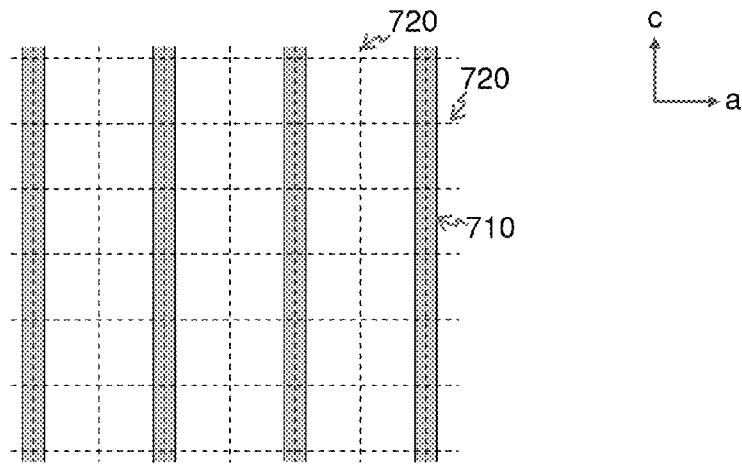
FIG. 7a illustrates examples of a lateral over-growth mask window openings as applied to a compound semiconductor template for an emissive imager pixel array.

It is clear that a compound semiconductor light emitting layer that contains microstructural defects in high densities only in areas that will not be electrically active in subsequent emissive imager fabrication would provide significant performance improvements compared to compound semiconductor light emitting layers that contain a uniformly high defect density. FIG. 6a illustrates one embodiment of the selective LEO mask as applied to a compound semiconductor template 620 used in the fabrication of an emissive imager device. In FIG. 6a the LEO growth windows 640 would be realized by etching away in selected areas of the dielectric mask material 630 initially deposited on top of the compound semiconductor material. As illustrated in FIG. 6a, the LEO growth windows 640 would be formed in a given pattern that would match the regions of the imager die which will not constitute active regions, for example, the gaps between the imager dies 525, the gaps 535 between the imager pixels within each imager die or the pixel waveguide aperture areas 537 within each pixel. Specifically, FIG. 7a illustrates one embodiment of this invention in which the LEO growth windows 710 are formed as lateral stripes in alignment with the imager device die array or pixels' array boundaries 720. In FIG. 7a the lateral pattern of LEO growth window stripes 710 are formed along only one axis of the pixel boundaries 720 and in one embodiment would be aligned with the pixel gaps 535 and possibly also aligned with gaps 525 between device dies. The embodiment illustrated in FIG. 7a and FIG. 7b also includes the formation of LEO windows along both axes of the pixel and die boundaries.

Figure 7B:
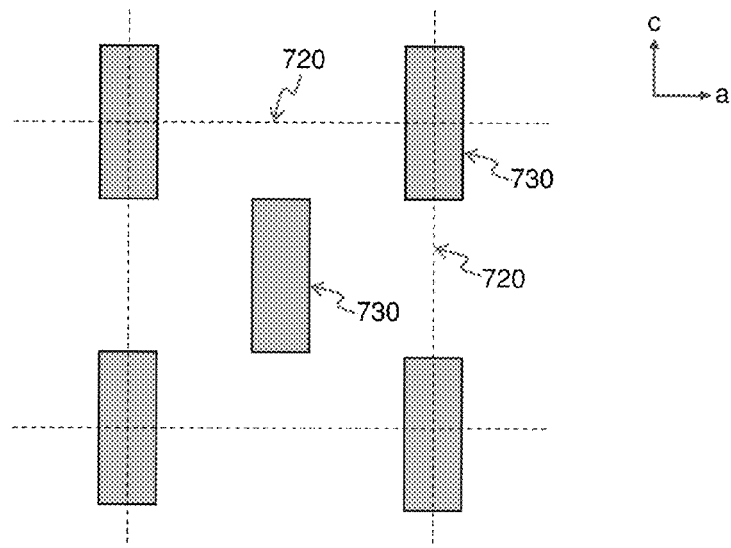
FIG. 7b illustrates a lateral overgrowth windows pattern of stripes as applied to a compound semiconductor template for an emissive imager pixel array.

FIG. 7b illustrates another embodiment of this invention in which a pattern of discrete size windows 730 are used as LEO growth windows. The discrete size LEO growth windows 730 illustrated in FIG. 7b would typically be aligned with the imager device die array or pixels' array boundaries 720 and would be either formed along one axis of the imager pixels and dies boundaries 720 or both axes of the imager pixels and dies boundaries 720. It would also be possible to form the LEO growth windows 710 and 730 illustrated in FIGS. 7a and 7b; respectively, along the boundaries 720 of multiple pixels, for example, the LEO growth strips illustrated in FIG. 7a or the discrete size windows 730 illustrated in FIG. 7b could be created to overlap with the boundaries 720 of a group of 2, 3, . . . , or 10 pixels. The choice of the spacing of the LEO growth windows 710 and 730 illustrated in FIG. 7a and FIG. 7b; respectively, depends on the dimensions of the imager pixels and the desired spacing between the LEO growth windows.

Figure 7C:
FIG. 7c illustrates a lateral overgrowth pattern of discrete windows as applied to a compound semiconductor template for an emissive imager pixel array emissive imager lateral overgrowth mask pattern with discrete windows.

FIG. 7c illustrates one embodiment of this invention in which the LEO growth windows 740 are formed as discrete areas in alignment with the pixels' waveguide aperture areas 537 of the imager pixels. It should be noted that in this case the number of formed LEO windows need not to match the exact number of waveguides that maybe formed with the areas of each imager's pixels. For example, it could be sufficient to form the LEO growth windows 740 in alignment with the waveguide aperture areas 537 within the central region of the imager pixels. It should also be noted that in this case the LEO growth windows 740 need not to be formed within the waveguide aperture areas of every pixel with the imager die. Instead the LEO growth windows 740 could be formed in a pattern having a spatial period that spans the width of multiple of the image's pixels. It should be noted that the shape of the LEO growth windows that are formed in alignment with the pixels waveguides can either match the shape of the waveguide aperture area or have a different shape that would avoid the propagation of the threading dislocations of the pixel electrically active regions. For example, FIG. 7c illustrates two possible different shapes for the LEO growth windows 740 both being fully included within the pixels' waveguide aperture areas 537 of the imager pixels.

Figure 6B:
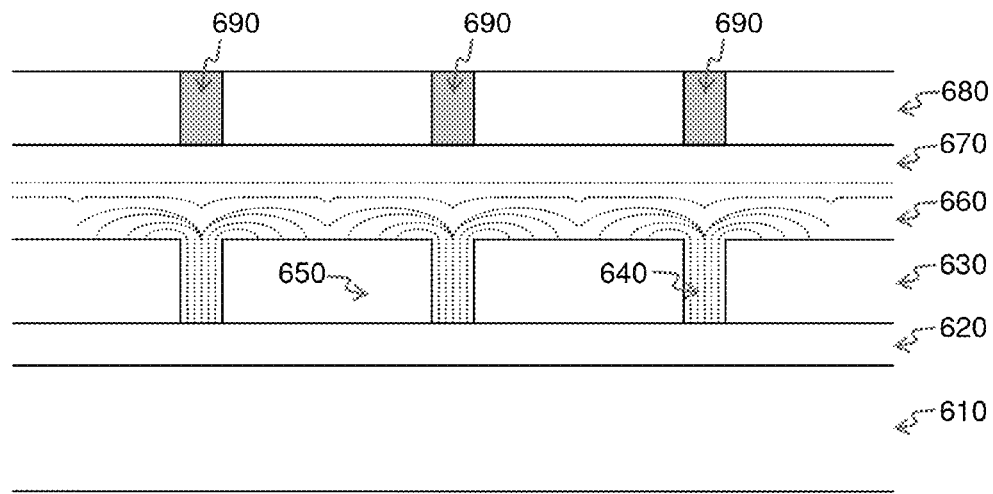
FIG. 6b is a cross sectional view illustrating the various layers of the lateral over-growth methods of this invention.
Figure 8:
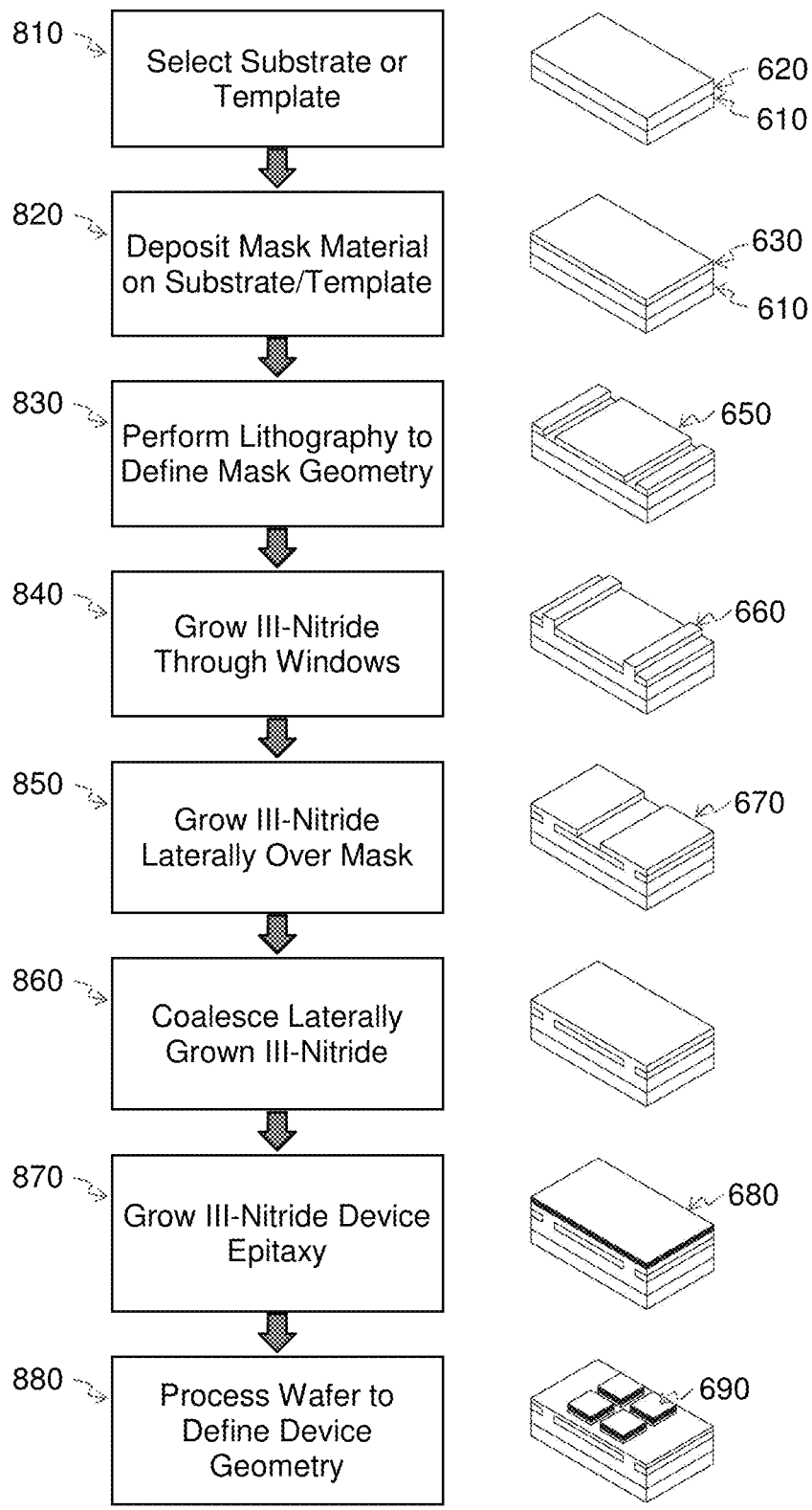
FIG. 8 illustrates an example of the processing steps for the lateral epitaxial overgrowth methods of the invention.

In the preferred embodiment of this invention, lateral overgrowth is utilized across the majority of the area of a light-emitting die. FIG. 8 illustrates an example of the processing steps for the lateral epitaxial overgrowth method of the invention, with reference to structures and layers that are illustrated in FIG. 6a and FIG. 6b. In step 810 of FIG. 8, a suitable substrate or template 610 would be selected for compound semiconductor re-growth. Any substrate that offers a compatible lattice structure such that the desired compound semiconductor material may grow epitaxially upon is acceptable for the practice of this invention. For example, without limiting the scope of the invention, a (0001) c-plane sapphire ($Al_2O_3$) would be a suitable substrate 610 choice if the compound semiconductor to be grown is gallium nitride. The substrate 610 can be planar (uniformly smooth), patterned with surface features so as to reduce the initial dislocation density of the nucleated compound semiconductor (such as a PSS—patterned sapphire substrate), roughened stochastically, or otherwise processed to tailor the properties of the film to be grown upon it or to alter light extraction through it or other device property subsequent to growth.

Alternately, a template can be selected for the compound semiconductor regrowth. For the purposes of this invention, a template is any substrate 610 that has been pre-deposited with a III-nitride film 620 having a thickness ranging from 10 nm to 1000 µm. Use of templates can lead to improvements in material quality and device yield in the overall manufacturing process, but are not strictly required for the practice of the invention. Further, it is possible to select a suitable substrate and then grow a template layer in the same process flow as the practice of the invention. The terms "template" and "substrate" will therefore be used interchangeably in the description of the embodiments without limiting the scope of the invention.

Once a substrate has been selected, a mask layer material 630 is deposited on the substrate in step 820 of FIG. 8. Any material that: (1) discourages the adhesion of III-nitride material within the timeframe required to execute the epitaxy processes described herein, and (2) can be patterned with any suitable etching technique as described below, is suitable for the practice of this invention. Some examples of viable mask materials 630 include, but are not limited to, silicon dioxide, silicon nitride, titanium nitride, titanium, or hafnium oxide. The mask material thickness can vary from approximately 5 nm to approximately 100 µm in thickness.

FIG. 6a also illustrates a typical mask layer 630 geometry which is created through conventional photolithographic semiconductor processing in step 830 of FIG. 8. A typical process flow would involve spin coating photoresist on the mask material; selectively exposing the photoresist to light, x-rays, or electrons; developing the photoresist to yield a pattern of residual photoresist and areas of exposed mask material; etching the exposed mask material down to the underlying substrate or template material, and removing the photoresist layer. One skilled in the art will recognize that such photolithographic processing is common practice with the semiconductor industry, and that many slight variations of such processes exist. The invention is generally insensitive to subtle variations in the photolithography process provided that the net effect is the mask layer 630 depicted in FIG. 6a with a surface that contains areas 640 of exposed substrate/template material, herein referred to as re-growth windows, and areas 650 covered by mask material.

One skilled in the art will recognize that, depending on the mask material and its thickness, and the geometry of the mask pattern, it may be possible to reverse the order of blocks 620 and 630 in the practice of this invention. Such a reverse process is referred to as a "lift-off" lithography process in which mask material 630 that is deposited on the un-developed photoresist is "lifted-off" of the underlying substrate/template, leaving mask material on the areas that were not originally coated with photoresist. The choice of an etch-based mask definition process versus a lift-off mask definition process is immaterial to the practice of the invention.

Of particular importance in the practice of the invention is the description of the mask layer 630 geometry. Several examples of relevant geometries will be described in successive embodiments with the understanding that other variations are possible within the scope of the invention. The ultimate objective of the invention is to create regions of high III-nitride material quality that will be electrically active in a functional device, while potentially sacrificing material quality in regions that will be electrically inactive or ultimately etched out of the device structure completely. Many device geometries containing combinations of electrically active and inactive regions can be envisioned without deviating from the fundamental concepts embodied by this invention.

In one embodiment of this invention, the mask layer 630 geometry would be selected such that the area within a device die 520 is coated with mask material to be overgrown with low defect-density III-nitride material. FIG. 7a illustrates this concept in which block 720 is considered the smallest indivisible unit of the device being fabricated. As explained earlier, there may be a variety of features within the die 520 m, including, but not limited to pixels, contacts, test structures, traces, and waveguides. The regions between the die are referred to as the "streets. A portion of the die streets may be sacrificed for singulating (dicing, cleaving, or cutting) the wafer into discrete die. In this embodiment, the mask is patterned such that the mask material coats the entire die area 520 but is absent over the street areas 525. In some variants of this embodiment, it may be desirable to pattern the mask such that the masked area covers the entire die area 520 and a fraction of the street areas 525. In one such variant, illustrated in step 880 of FIG. 8, every second street is covered with mask material such that when coalescence occurs in the step 860, such coalescence may occur over a street area rather than over a die area. Such variations in the percentage of die and street area covered by the mask are consistent with the practice of this invention.

Referring to FIG. 6a, the areas 640 within the mask layer 630 not covered by mask material act as "windows" to the underlying substrate or template 610 material. FIG. 6b illustrates a cross sectional view of the layers shown in FIG. 6a after the re-growth of III-nitride material on top of the mask layer 630. In FIG. 6b the layer 660 is a group III-nitride material that is grown vertically through the windows 640 in the mask material 630 using a suitable epitaxy technique, including but not limited to MOCVD or HVPE. The extent of the vertical growth of the III-nitride layer 660 is dictated by process parameter and growth technique selection and design considerations. For example, in some embodiments it may be preferable to minimize protrusion of the vertically-grown III-nitride material above the mask surface prior to initiating the lateral growth III-nitride layer 670, whereas in others it may be preferable to grow large III-nitride features over the windows prior to initiating lateral growth. One of the chief considerations in determining the preferred amount of vertical growth relates to the confinement of threading dislocations within the vertically grown material. In III-nitride crystal orientations that favor vertical propagation of threading dislocations, larger vertical growth extents may be preferable to ensure dislocations do not prematurely redirect laterally over the die area.

The grown III-nitride layer 660 represents a transition to lateral growth over the areas 650 covered by mask material. This transition may occur as a discrete step initiated by a change in epitaxy process parameters that encourages growth laterally from sidewalls. Alternately, this transition may occur spontaneously as a result of geometric considerations, namely the protrusion of the III-nitride material above the surface of the mask layer in the absence of any change in process parameters. It should be noted that during the lateral growth step, some vertical growth of III-nitride material will continue to occur. It is preferable, but not strictly necessary, during the lateral growth step for the lateral growth rate to exceed the vertical growth rate in order to minimize the surface area that will ultimately coalesce; large coalescence fronts can suffer from mass transport limitations that lead to subsurface void formation. One skilled in the art will recognize that variations in the ratio of lateral to vertical growth rates may be utilized in the practice of the invention without deviating from its scope.

The lateral growth rate of the III-nitride layer 670 need not be equal in all in-plane directions. For example, it is well known from the prior art that, for (11$\bar{2}$0) lateral growth in which the lateral growth directions predominantly lie along the [0001] c-direction, the lateral growth rate in the [0001] direction can be 10 times or more greater than the growth rate in the coaxial[0001] direction. Such asymmetry in lateral growth rate may be utilized to preferentially locate coalescence fronts outside of electrically active regions of the device structure.

It is important to note that, given proper selection of the mask layer 630 geometry for a given III-nitride crystal orientation and device design, threading dislocations can be predominantly prevented from propagating vertically through the laterally grown III-nitride layer 670 material. For the purpose of device performance, dislocations that intersect the free surface of the III-nitride may ultimately propagate into subsequently grown device layers. Therefore, it is preferable to perform the lateral III-nitride growth of the III-nitride layer 670 such that threading dislocations either: (1) do not redirect from the windows areas 640 into the laterally grown material areas 650 at all, or (2) bend into the laterally grown III-nitride material area 650 such that their growth direction will be approximately confined to a plane that will eventually be parallel to the free III-nitride surface. Some inclination of the dislocation direction may be acceptable if the dislocation is more likely to impinge on a coalescence front prior to reaching the free surface.

In reference to FIG. 8, an optional coalescence step 860 could be added in which the laterally grown III-nitride material in layer 670 impinges upon adjacent laterally grown III-nitride material. Coalescence is optional in that case, if the impingement occurs over the non-electrically active area of the eventual imager device, such a resulting gap may ultimately be covered or removed in subsequent device processing. In contrast, if the coalescence front is located within an electrically active area, it is preferable that the impinging facets be crystallographically aligned and the impingement area minimized so as to minimize the generation of threading dislocations at the coalescence front.

Step 870 of FIG. 8 refers to the growth of the layer 680 of FIG. 6, of the emissive imager device structures, after being grown on the lateral growth material top layer 670. Such device structures could consist of p-n junctions, single heterostructures, double heterostructures, one or more quantum wells, transistor structures, or other epitaxial structures that are compatible with compound semiconductor materials. The deposition process used to form such structures could occur in the same tool and even growth run as the lateral growth process, or could be performed in a separate tool and/or process. For example, MOCVD could be utilized for the epitaxial growth of both the lateral growth layer 670 and device structure deposition layer 680. Alternately, HVPE could be utilized for the lateral growth layer 670, the wafer removed from the HVPE reactor chamber, possibly characterized and cleaned, then transferred to an MOCVD growth system for deposition of the device structure layer 680. One skilled in the art will recognize that several conventional deposition processes and combinations thereof are compatible with the device structure growth step without departing from the scope of the invention.

Block 690 in FIG. 6$b$ and its related process step 880 of FIG. 8, represent device processing of the III/V semiconductor wafer to form the imager pixels' waveguides and sidewalls and delineate the device die boundaries. The invention is compatible with a multitude of different device types and processing sequences. The essential element of the invention with respect to said device processing is that the electrically active regions of each imager device die, such as block 690, would be predominantly located on the low defect density III-nitride material, while the defective regions are located in or over predominantly electrical inactive material.

Figure 9:
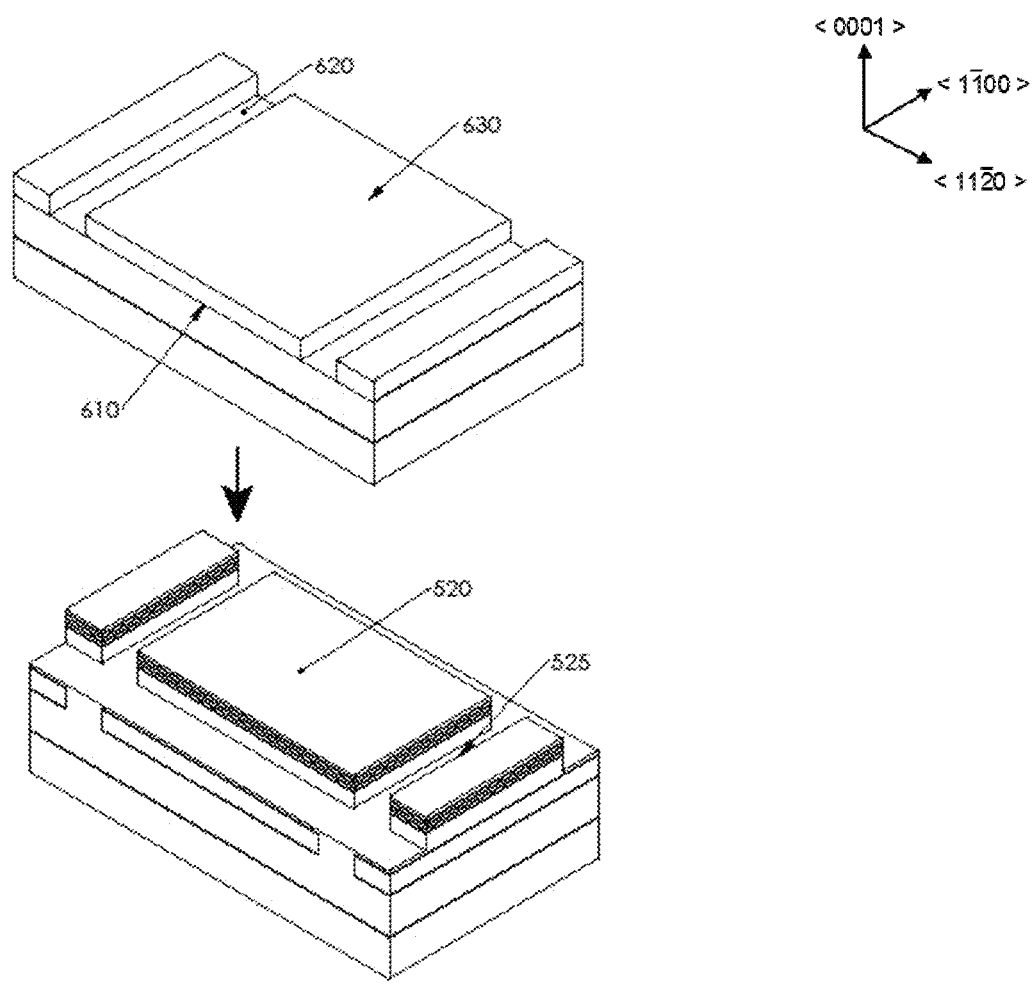
FIG. 9 illustrates the lateral epitaxial overgrowth process variant for c-plane III-nitride die.

In one embodiment of this invention, illustrated in FIG. 9, the free III-nitride surface, or substrate 610 that will yield said free III-nitride surface, is predominantly (0001) c-plane-oriented GaN. The windows 640 in the mask 630 consist of parallel channels oriented along the (1$\bar{1}$00) direction, positioned over the areas that will eventually be streets. The III-nitride lateral growth material proceeds predominantly in the (11$\bar{2}$0) directions over the die area, coalescing at the center of each die 520. The III-nitride film over the die area will be predominantly low dislocation density material that provides superior electroluminescence performance compared to the defective material in the street areas. The defective street material will ultimately be removed from the structure when the devices are singulated into die via etching, dicing, or laser cutting, leaving gaps 525 above the window regions.

An alternative to the example shown in FIG. 9 would be to orient the windows along the (11$\bar{2}$0) directions, with lateral growth proceeding in the (1$\bar{1}$00) direction. This approach would also yield low defect density material over the active die area. Dislocation redirection into the die area could occur if the growth conditions were such that prismatic plane formation is energetically favorable. However, even in the case of such less preferable dislocation redirection, the total dislocation density terminating at the free surface in the die area would be orders of magnitude lower than for devices grown without the present invention.

Figure 10:
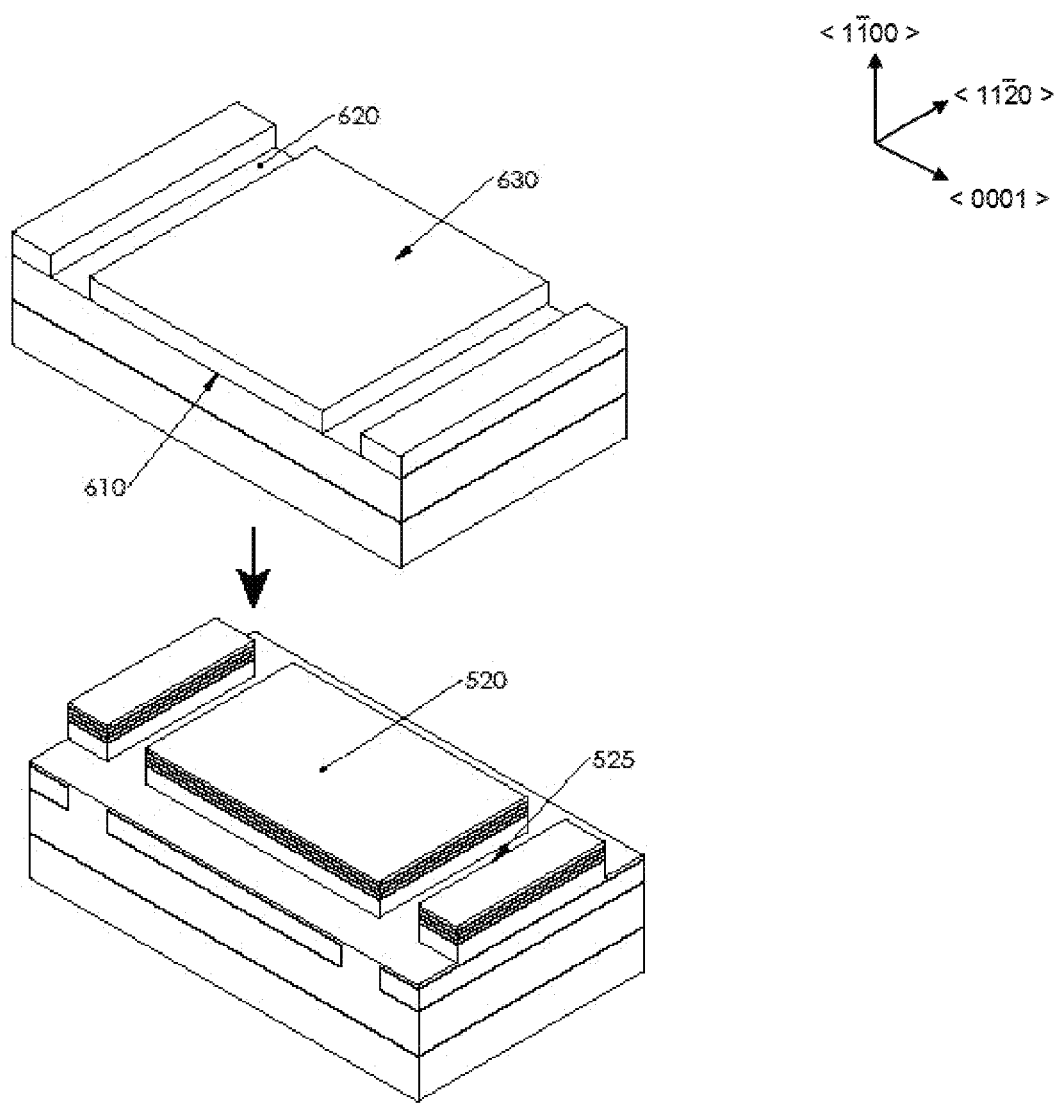
FIG. 10 illustrates of the lateral epitaxial overgrowth process variant for nonpolar m-plane oriented die.

An alternate embodiment is provided in FIG. 10, in which the free III-nitride surface 610 is predominantly nonpolar (1$\bar{1}$00) m-plane-oriented GaN. In this example, window channels 620 in the mask 630 are oriented along the (11$\bar{2}$0) direction. The resulting lateral growth will proceed along the (0001) directions with vertical {0001} c-plane sidewalls. The most favorable lateral growth process conditions for this embodiment would be tailored to suppress growth in the [000$\bar{1}$] direction in favor of growth in the Ga-polar [0001] direction. Such an approach would minimize basal plan stacking fault densities in the laterally grown material. As was noted for the c-plane oriented example above, alternate window geometries and orientations could be utilized in executing the nonpolar process illustrated in FIG. 10.

Figure 11:
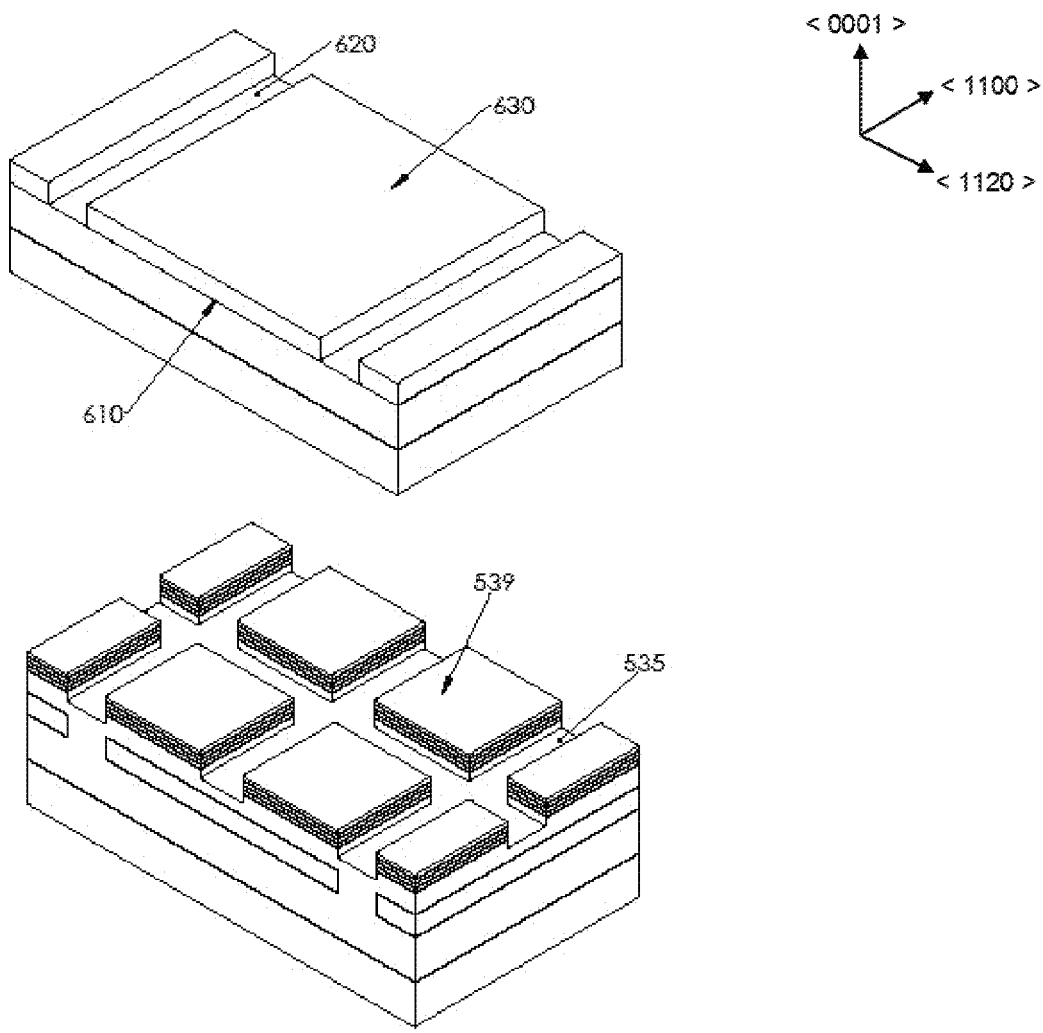
FIG. 11 illustrates of the lateral epitaxial overgrowth process variant for c-plane oriented pixels.

The embodiments of the invention illustrated in FIG. 9 and FIG. 10 involve lateral growth across entire imager device die areas 520. However, depending on the device contents of the die 520, it may be possible to subdivide the lateral growth process to reduce III-nitride lateral growth time and film thickness. For example, a die may consist of a pattern of electrically active pixels separated by electrically inactive material or gaps. An analogous example is shown in FIG. 11, which describes the application of the invention at the pixel 530 level rather than at the die 520 level. In this embodiment, the gaps 535 between pixels 530 are functionally equivalent to the die streets gaps 525 described above. However, within each die there would multiple windows and lateral growth regions. In this example, windows are patterned over regions that will be in alignment with the gaps 535 between pixels 530 within in the die 520 after the devices are processed using a one or multiple pixel periods. Vertical growth of III-nitride material proceeds through the windows, then lateral growth proceeds across the pixel area. Coalescence occurs in the center of the gap between each pixel pair. In subsequent device processing, the defective windows and the regions containing the coalescence fronts are etched away when the pixel geometry is formed. The remaining III-nitride material in the pixel region will be predominantly low defect density laterally grown material, yielding superior pixel behavior.

Figure 12:
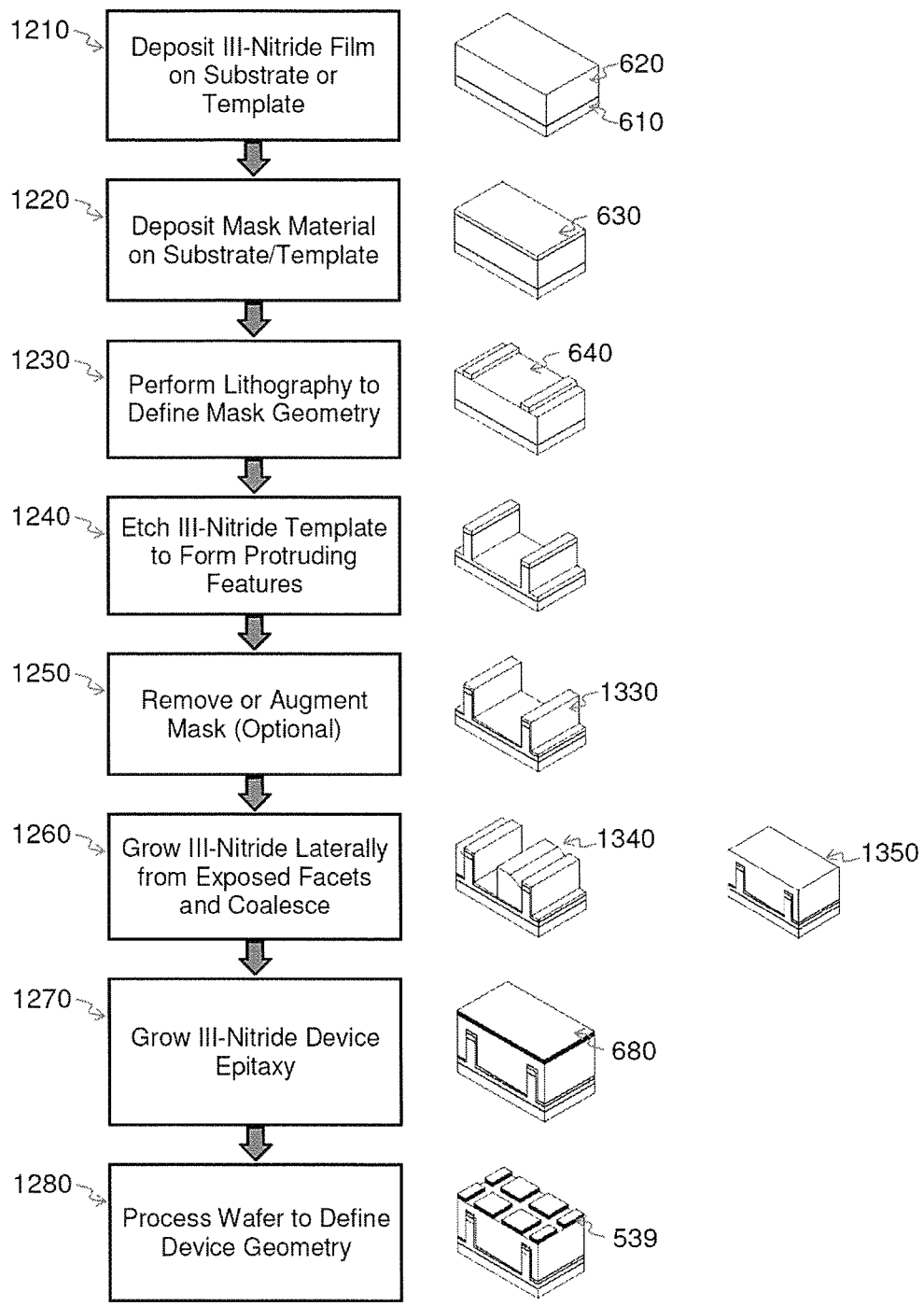
FIG. 12 outlines the process steps for the execution of the invention using sidewall lateral epitaxial overgrowth techniques.

The previous embodiments generally described the use of a lateral epitaxial overgrowth process to concentrate high quality III-nitride material in electrically active regions of a die or sub-regions of dies (pixels). The invention is equally compatible with the use of lateral growth from III-nitride facets that protrude from the substrate or template surface. FIG. 12 illustrates one such application of sidewall lateral epitaxial overgrowth to the practice of the invention. Block 1210 represents deposition of a III-nitride film or template layer on a substrate or template. The III-nitride film thickness could range from approximately 1 μm to approximately 1000 μm depending on the lateral extents to be overgrown. For example, but without limitation, if a 10 μm pixel area is to be overgrown from two sides, it would be most preferable to grow a 5 μm or thicker III-nitride template layer. Alternately, if the substrate is a III-nitride substrate or template itself, the step represented by block 1210 could be omitted.

After the template layer is deposited, a mask material 1220 is applied to the template layer 1210. For small projected lateral growth extents, it may be sufficient to utilize photoresist as this mask material. For example, the pixel area to be overgrowth is approximately 2 μm across, then deposition of a 1 μm-thick photoresist mask may be sufficient for this step. For larger lateral growth extents, it is generally desirable to deposit a "hard mask" material such as those described above, including silicon dioxide or silicon nitride. However, whereas selectivity for III-nitride growth was the primary consideration when selecting a mask material for the previous embodiment, etch resistance will be a more important factor in the present embodiment as the mask will be utilized as a etching mask first and foremost. As such, metal masks may be useful for this step. Most preferably, a mask material would be selected that provides both etch resistance and III-nitride growth selectivity. Materials such as, but not limited to, silicon dioxide and silicon nitride can offer both etch resistance and III-nitride deposition selectivity.

Block 1230 of FIG. 12 represents performing photolithographic processing to define the mask geometry. In this step, the mask geometry should be dictated by the inverse of the eventual device geometry. For example, if the device consists of a pattern of die areas separated by street areas, then the mask material should be removed from areas that will eventually be converted to die, leaving mask material covering the areas that will become street. As with the previous embodiment, it is possible to reverse the order of steps 1220 and 1230 to utilize lift-off processing if desired without deviating from the scope of the invention. At the conclusion of this step, regions of III-nitride template material will be exposed approximately where die or pixels will be formed, while electrically insignificant areas will be covered with the mask material.

Block 1240 represents etching the III-nitride template material with a suitable etch technique, such as, but not limited to, inductively coupled plasma etching, reactive ion etching, or wet chemical etching. Any etching technique may be used in the practice of the invention provided that approximately vertical sidewalls having epi-ready surfaces can be achieved with the etch technique. The etch depth should generally be at least equal to the lateral growth extent that is required from the sidewall to be formed. For example, if a 10 μm pixel area must be laterally overgrown from two sides, then a 5 μm lateral growth will be required, and hence a 5 μm minimum etch depth is preferable. However, other etch depths and aspect ratios can be successfully utilized in the practice of the invention. The end result of this block 1240 will be the formation of protruding regions having epi-ready sidewalls separated by gaps that will eventually contain electrically active material.

Block 1250 represents the optional modification, augmentation, or removal of the residual mask from the protruding features. Mask removal will be necessary if the mask material is incompatible with subsequent lateral growth processes. For example, some metal mask materials or photoresist may form unfavorable byproducts when exposed to an MOCVD's growth chemistry. Alternately, other mask materials may promote unfavorable polycrystalline III-nitride deposition on the top of the protrusions, adversely affecting subsequent device processing. Removal of the mask may be performed with any ex situ stripping technique that attacks the mask material without attacking the underlying III-nitride material. Alternately, it may be desirable to modify or remove the mask in situ in the deposition chamber for the subsequent lateral growth step. For example, an aluminum hard mask could be converted to more favorable aluminum nitride within an HVPE growth chamber prior to initiation of lateral growth. Alternately, the same aluminum mask could be stripped in the same HVPE chamber through exposure to hydrogen chloride gas at sufficiently low temperatures so as to avoid etching of the underlying III-nitride material. Alternately still, a silicon mask could be converted to silicon nitride in either an MOCVD or HVPE chamber via pre-flow of ammonia. One skilled in the art will recognize that many such combinations of process steps could be utilized for modification or removal of the residual mask material.

Alternately, it may be advantageous to augment the mask layer. For example, it may be desirable for some combinations of open pixel area and protruding street area to deposit additional mask material on the horizontal exposed III-nitride surfaces between the protrusions. Doing so would minimize the risk of vertical growth of defective III-nitride interfering with lateral growth of low defect density laterally grown III-nitride material from the exposed sidewalls. Alternately, it may be desirable to coat less favorable exposed sidewalls with mask material. For example, but without limitation, if the III-nitride protrusions contain exposed (0001) and (000$\bar{1}$) sidewalls, it may be preferable to deposit mask material on the less favorable (000$\bar{1}$) sidewalls while leaving the preferred (0001) III-nitride sidewalls exposed. Such mask augmentation must generally be performed with directional deposition techniques such as, but not limited to, electron beam evaporation to ensure that preferred facets and sidewalls are not coated with mask material. At the conclusion of the step represented by block 1250, at least one preferred III-nitride sidewall or facet should be exposed or uncovered by mask material for subsequent lateral growth to succeed.

Block 1260 of FIG. 12 represents performing a lateral growth from one or more exposed sidewalls of the protruding III-nitride material. The lateral growth proceeds over the etched out area of the wafer, filling in with low-defect density III-nitride material. Vertical growth that emerges from the laterally grown material will similarly contain low threading dislocation densities. Given sufficient growth time, lateral growth will proceed until the III-nitride impinges upon an adjacent III-nitride growth front or a masked protrusion.

Block 1270 of FIG. 12 represents growth of the device structures, analogous to block 870 above. Similarly, Block 1280 represents wafer-level processing of the device structures to form die, pixels, and other features. No functional differences exist in these two embodiments subsequent to coalescence of the III-nitride laterally grown material step 1260.

Figure 13:
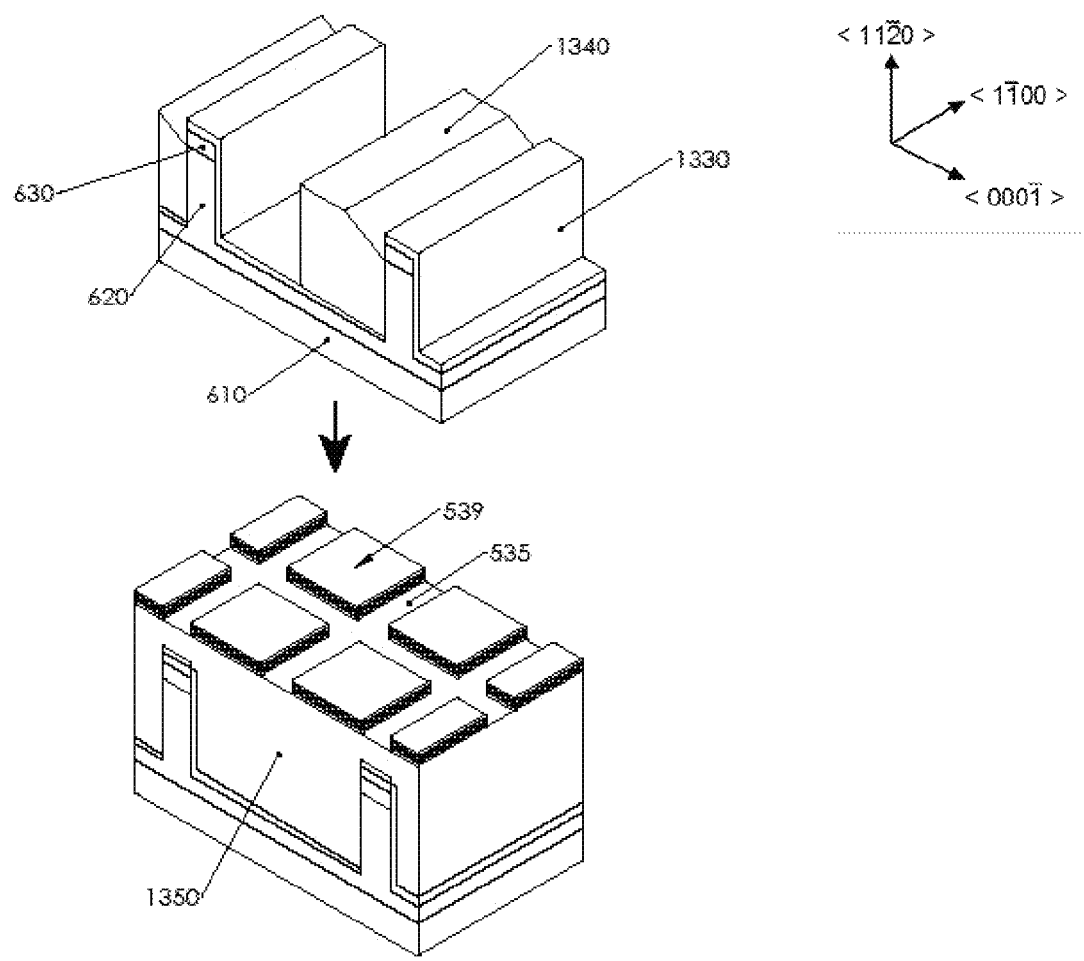
FIG. 13 illustrates the sidewall lateral epitaxial overgrowth variant of the invention for nonpolar a-plane III-nitride pixels.

In an example of the embodiment outlined in FIG. 12, that is illustrated in FIG. 13, the free III-nitride surface is predominantly nonpolar (11$\bar{2}$0) a-plane-oriented GaN. A silicon dioxide mask material 630 having a thickness of approximately 1 μm is deposited on the GaN template with plasma-enhanced chemical vapor deposition. The windows in the mask 630 consist of a pattern of approximately 19 μm wide stripes being oriented along the (1$\bar{1}$00) direction, positioned over the areas that will eventually be predominantly two rows of pixel material, and separated by parallel 1 μm-wide masked stripes. The III-nitride template is etched via chlorine-based reactive ion etching, yielding approximately 19 μm-wide trenches with III-nitride pillars protruding approximately 12 μm from the trench bottoms. The oxide mask is augmented by performing a directional SiO$_2$ electron beam evaporation deposition 1330 to coat the exposed (000$\bar{1}$) facets on the protruding stripes as well as the bottoms of the 19 μm-wide trenches. The III-nitride lateral growth material 1340 grows predominantly in the [0001] direction from the uncoated vertical sidewalls of the protrusions over the eventual pixel area, coalescing at the adjacent protrusion to yield a continuous GaN film 1350. The coalescence fronts will eventually be etched away as they lie in areas that will be gaps 535 between pixels. The III-nitride film over the die area will be predominantly low dislocation density material that provides superior electroluminescence performance compared to the defective material in the street areas. The defective protrusions will also be removed from the structure when the pixels are etched into the die. While this example utilized m-axis oriented stripes, alternate stripe orientations could be utilized with similar effect. Further, the protrusions need not be stripes, but could consist of a grid with lateral growth proceeding in multiple directions simultaneously.

It should be noted that while the embodiments illustrated in FIG. 12 and FIG. 13 described lateral growth from etched III-nitride material, it is possible to execute the same lateral growth from dissimilar etched substrate material. By way of example, an (1$\bar{1}$00) m-plane sapphire substrate could be etched to yield exposed (0001) c-plane sapphire sidewalls, and (0001) c-plane GaN could be laterally grown from those exposed sidewalls. Such laterally grown GaN would contain higher dislocation densities than the III-nitride material grown laterally from exposed III-nitride sidewalls. However, the device layers subsequently grown on the laterally-grown GaN would likely contain a lower dislocation density than had they been grown directly on a planar GaN template that was otherwise produced without the use of this invention. Execution of such lateral heteroepitaxy, while possible within the scope of this invention, is generally expected to yield less desirable defect reduction than can be achieve with the preferred embodiments described above.

The Embodiments described thus far have described lateral growth across die or pixel areas. However, it is also possible to implement the methods of this invention with a mask geometry that encourages lateral growth from both inter-die street areas 525 and inter-pixel gap areas 535 concurrently. The mask in such an instance consists of two interpenetrating grids, one a bounding box around the die area centered in the inter-die street, and a second grid within the die area having window openings corresponding to areas that will become inter-die gaps. The period of the die mask corresponds to the eventual die period, for example 3 mm×2 mm along the (11$\bar{2}$0) and (1$\bar{1}$00) directions, respectively, with 5 μm wide windows in each axis. The pixel mask similarly corresponds to the period of the pixel array within the die, in this example 20×20 μm with 2 μm-wide windows in each axis. The steps of the invention are practiced comparably to those provided in the previous examples.

Typically die 520 and pixels 530 are present in periodic fashion on semiconductor wafers 510 used for emissive imager devices, and are thus suitable for use as guiding features for the mask layout in the present invention. In fact, virtually any periodically occurring, electrically-inactive feature in the eventual device structure is suitable as a location for windows in the mask for the lateral overgrowth process outlined in FIG. 8 or for the seed protrusions in the sidewall lateral overgrowth process outlined in FIG. 12. An example of such a usable feature is the waveguide aperture areas identified as block 190 in FIG. 1 or block 537 in FIG. 5. Utilizing the lateral overgrowth approach of FIG. 8, the mask would be etched away in regions approximating the waveguide locations, for example using aperture geometries described in FIG. 7c. Vertical growth would proceed through the apertures, transitioning to lateral growth and proceeding outwards until coalescence occurs. Analogously, for execution of the sidewall lateral growth approach of FIG. 12, all mask material except that over the eventual waveguide locations would be etched away, as would the underlying III-nitride template. Sidewall lateral growth could proceed from the resultant pillars until coalescence occurs. While the waveguide apertures have been used for illustrative purposes, one skilled in the art will recognize that a variety of periodically occurring feature in the ultimate imager device can be successfully utilized in the practice of the invention.

For some device geometries, it may further be advantageous to utilize three levels of device feature geometries for the execution of the invention. For example, the mask could be constructed so as to promote vertical/lateral growth from die street areas 525, pixel gap areas 535, and waveguide aperture areas 537. The principal advantage of such a multi-fold approach is a reduction in lateral growth time required to achieve coalescence compared to the use of a single feature. However, one must recognize that it is generally beneficial to maintain common crystal facets in the lateral growth process to normalize lateral growth rates and ensure planar surfaces upon coalescence.

The present invention provides several means of localizing microstructural defects to electrically inactive regions, such as the pixels' areas 539, of the semiconductor light emitting layer or layers in an emissive imager. The active regions of the light emitting layer will contain sharply reduced defect densities and therefore emit light at higher efficiencies and be capable of increased luminous flux emission.

The illustrations above generally described lateral growth processes and surface normals limited to the principal axes of common compound semiconductors. However, many other mask orientations and growth geometries may be utilized in the successful implementation of the invention. For lateral growths using vertical sidewalls (as described above), the low defect density regions will generally be located directly above the masked regions on the template wafers. However, when inclined sidewalls are grown, as would be the case for many semi-polar GaN LEO implementations, dislocations will propagate in an inclined fashion relative to the wafer surface. The low defect density regions may be offset from the mask in this case. In fact, the most favorable location on which to fabricate electrically active device structures is often directly above the window openings for semipolar lateral overgrowth processes of sufficient film thickness. In the general case, one skilled in the art will take note of the known propagation directions of microstructural defects emerging from windows in the mask material, and will calculate a suitable lateral offset for the location of the electrically inactive portions of the device structure based on the propagation angle of the defects relative to the surface normal and the thickness of laterally-grown III-nitride material to be deposited.

With respect to all embodiments, it should be clear to one skilled in the art that alignment of mask layers to eventual emissive imager or other device geometry is critical for successful implementation of the invention. Misalignment of device structures relative to the laterally grown, low-defect density compound semiconductor material could lead to degradation of device performance due to overlap of electrically active device structures with defective window material. Substrate features such as orientation flats may be sufficient for such alignment with adequate mask design and comparatively gross feature sizes. Incorporation of alignment marks into the mask design may be preferable for superior alignment control for micrometer-scale mask features.

Those skilled in the art will readily appreciate that various modifications and changes can be applied to the embodiments of the invention without departing from its scope defined in and by the appended claims. It should be appreciated that the foregoing examples of the invention are illustrative only, and that the invention can be embodied in other specific forms without departing from the spirit or essential characteristics thereof. The disclosed embodiments, therefore, should not be considered to be restrictive in any sense. The scope of the invention is indicated by the appended claims, rather than the preceding description, and all variations which fall within the meaning and range of equivalents thereof are intended to be embraced therein.

What is claimed is:

1. A method of forming an emissive imager device surrounded by streets, the emissive imager device consisting of an array of light emitting areas separated by electrically inactive areas formed on a laterally overgrown compound semiconductor layer wherein:
   the compound semiconductor layer consists of gallium nitride, aluminum nitride, indium nitride, gallium arsenide, gallium phosphide, aluminum arsenide, indium phosphide, indium arsenide, or alloys thereof;
   the laterally overgrown compound semiconductor layer is grown, in whole or in part, via a lateral epitaxial overgrowth or sidewall lateral epitaxial overgrowth process that utilizes a mask;
   a lateral growth rate of the laterally overgrown compound semiconductor layer in each in-plane direction is selected such that coalescence of the laterally overgrown compound semiconductor layer occurs in one or more of the electrically inactive areas of the compound semiconductor layer;
   the mask window geometry for the lateral epitaxial overgrowth or sidewall lateral epitaxial overgrowth process utilizes one or more of the electrically inactive areas of the compound semiconductor layer as windows or protrusions for sidewall growth, respectively;
   the mask window geometry for the lateral epitaxial overgrowth or sidewall lateral epitaxial overgrowth process is selected to yield an average threading dislocation density in the light emitting areas of less than approximately $1 \times 10^9$ cm$^{-2}$;
   growing light emitting layers upon the laterally overgrown compound semiconductor layer; and
   forming the light emitting areas from the light emitting layers.

2. The method of claim 1 wherein the lateral epitaxial overgrowth process comprises:
   a) depositing a layer of mask material onto a substrate or template;
   b) patterning the layer of mask material with a window geometry associated with periodic locations of inactive areas between the light emitting areas;
   c) growing the compound semiconductor layer on the substrate or template as exposed through the windows in the mask material; and
   d) re-growing the compound semiconductor layer laterally over the mask material.

3. The method of claim 2 wherein the window geometry consists of a pattern of parallel stripes oriented along an axis shared by electrically inactive regions of the emissive imager device.

4. The method of claim 2 wherein the window geometry consists of a pattern of discrete asymmetrical shapes including rectangles, ovals, ellipses, slots, or diamonds.

5. The method of claim 2 wherein the window geometry is offset from the electrically inactive regions of the emissive imager device to account for inclined propagation of microstructural defects within the laterally overgrown compound semiconductor.

6. The method of claim 2 further comprising coalescing the laterally grown compound semiconductor layer to form a continuous layer.

7. The method of claim 2 wherein the compound semiconductor layer is formed on a substrate or template of a material selected from the group consisting of aluminum oxide, silicon, magnesium aluminate, silicon carbide, zinc oxide, gallium nitride, aluminum nitride, indium nitride, gallium arsenide, gallium phosphide, indium phosphide, or alloys thereof.

8. The method of claim 7 wherein the substrate or template comprises a substrate coated with one or more layers of a template compound semiconductor material.

9. The method of claim 2 wherein the mask material is selected from the group consisting of silicon oxide, silicon nitride, titanium nitride, tungsten, or titanium.

10. The method of claim 2 wherein the mask window geometry approximates or fits within the locations of inter-die streets of an emissive imager wafer.

11. The method of claim 2 wherein the mask window geometry approximates or fits within the electrically inactive areas between the light emitting areas of the emissive imager device.

12. The method of claim 2 wherein the mask window geometry approximates or fits within locations of waveguides within the light emitting areas.

13. The method of claim 2 wherein the mask window geometry approximates or fits within locations of two distinct classes of inactive areas.

14. The method of claim 2 wherein the mask window geometry is offset from the locations of one or more distinct classes of inactive areas.

15. The method of claim 2 wherein the lateral growth of compound semiconductor material is performed with a growth technique selected from the group consisting of metalorganic chemical vapor deposition, hydride vapor phase epitaxy, molecular beam epitaxy, liquid phase epitaxy, and physical vapor transport.

16. The method of claim 2 wherein the light emitting areas are deposited with an epitaxial growth technique selected from the group consisting of metalorganic chemical vapor deposition, hydride vapor phase epitaxy, molecular beam epitaxy, liquid phase epitaxy, or physical vapor transport.

17. The method of claim 2 wherein the light emitting areas comprise either laser diodes or light emitting diodes.

18. The method of claim 1 wherein the sidewall lateral epitaxial overgrowth process comprises:
    selecting a suitable substrate or template for compound semiconductor growth;
    depositing a mask material that provides selectivity in the subsequent growth of compound semiconductor material;
    patterning of the mask material with a mask window geometry that is governed by the periodic locations of the light emitting areas of the emissive imager;
    performing an etching process to remove compound semiconductor material exposed by the mask window geometry to create a periodic array of protrusions of compound semiconductor material;
    performing a re-growth of compound semiconductor material first laterally from one or more sidewalls of the protrusions, then re-growing compound semiconductor material concurrently vertically and laterally;
    depositing one or more electrically and/or optically active compound semiconductor device layers upon the laterally grown compound semiconductor material;
    processing the device layers to define emissive imager device structures.

19. The method of claim 18 further comprising:
    deposition, on the substrate or template, of compound semiconductor material of similar composition to that which will ultimately comprise the optically active material in the emissive imager, and wherein processing the device layers includes processing of that compound semiconductor material, to define emissive imager device structures.

20. The method of claim 18 wherein regrowing the compound semiconductor material includes coalescing the laterally growing compound semiconductor material to form a continuous film or layer.

21. The method of claim 18 wherein the material of the compound semiconductor layer is selected from the group consisting of one or more of gallium nitride, indium nitride, aluminum nitride, gallium arsenide, gallium phosphide, indium phosphide, aluminum arsenide, and alloys thereof.

22. The method of claim 18 wherein the substrate is selected from the group consisting of aluminum oxide, silicon, magnesium aluminate, silicon carbide, zinc oxide, gallium nitride, aluminum nitride, indium nitride, gallium arsenide, gallium phosphide, indium phosphide, or alloys thereof.

23. The method of claim 22 further comprising coating the substrate with one or more layers of template compound semiconductor material.

24. The method of claim 18 wherein the mask material is selected from the group consisting of silicon oxide, silicon nitride, titanium nitride, tungsten, or titanium.

25. The method of claim 18 wherein the mask window geometry approximates or fits within the locations of periodic light emitting areas in the emissive imager device.

26. The method of claim 18 wherein the mask window geometry approximates or fits within locations of dies of a wafer of emissive imager devices.

27. The method of claim 18 wherein the mask window geometry approximates or fits within the locations of the light emitting areas within an emissive imager device die.

28. The method of claim 18 wherein the mask window geometry approximates or fits within light emitting areas but exclusive of intra-pixel waveguides.

29. The method of claim 18 wherein the mask window geometry approximates the periodic locations of two or more distinct classes of light emitting areas in the emissive imager device.

30. The method of claim 18 wherein the mask window geometry is offset from the approximate locations of one or more distinct classes of periodic light emitting areas.

31. The method of claim 18 wherein the lateral growth of compound semiconductor material is performed with a growth technique selected from the group consisting of metalorganic chemical vapor deposition, hydride vapor phase epitaxy, molecular beam epitaxy, liquid phase epitaxy, or physical vapor transport.

32. The method of claim 18 wherein the light emitting areas are deposited with an epitaxial growth technique selected from the group consisting of metalorganic chemical vapor deposition, hydride vapor phase epitaxy, molecular beam epitaxy, liquid phase epitaxy, or physical vapor transport.

33. The method of claim 18 wherein the light emitting areas comprise either laser diodes or light emitting diodes.

34. The method of claim 3 wherein the pattern of parallel stripes comprises a pattern of 19 μm wide stripes separated by parallel 1 μm wide masked stripes.

35. The method of claim 1 wherein the mask window geometry corresponds to a period of the array, the period of the array being 20 μm×20 μm with 2 μm wide windows.

36. The method of claim 1 wherein the protrusions comprise a grid with the lateral growth of compound semiconductor material proceeding in multiple directions simultaneously.

37. A method of forming an emissive imager device surrounded by streets, the emissive imager device consisting of an array of light emitting areas separated by electrically inactive areas formed on a laterally overgrown compound semiconductor layer wherein:
the compound semiconductor layer consists of gallium nitride, aluminum nitride, indium nitride, gallium arsenide, gallium phosphide, aluminum arsenide, indium phosphide, indium arsenide, or alloys thereof;
the laterally overgrown compound semiconductor layer is grown, in whole or in part, via a lateral epitaxial overgrowth or sidewall lateral epitaxial overgrowth process that utilizes a mask;
a mask window geometry for the lateral epitaxial overgrowth or sidewall lateral epitaxial overgrowth process utilizes one or more of the electrically inactive areas of the compound semiconductor layer as windows or protrusions for sidewall growth, respectively;
the mask window geometry for the lateral epitaxial overgrowth or sidewall lateral epitaxial overgrowth process is selected to yield an average threading dislocation density in the light emitting areas of less than approximately $1 \times 10^9$ cm$^{-2}$;
the mask window geometry comprises interpenetrating grids including a first grid and a second grid, the first grid being a bounding box around a die area centered in an inter-die street of an emissive imager wafer and the second grid being within the die area having window openings corresponding to an area that will become an inter-die gap of the emissive imager wafer;
light emitting layers are grown upon the laterally overgrown compound semiconductor layer; and
the light emitting areas are formed from the light emitting layers.

38. The method of claim 18 wherein the etch depth of the etching process is at least equal to the lateral growth forming the sidewall.

39. A method of forming an emissive imager device surrounded by streets, the emissive imager device consisting of an array of light emitting areas separated by electrically inactive areas formed on a laterally overgrown compound semiconductor layer wherein:
the compound semiconductor layer consists of gallium nitride, aluminum nitride, indium nitride, gallium arsenide, gallium phosphide, aluminum arsenide, indium phosphide, indium arsenide, or alloys thereof;
the laterally overgrown compound semiconductor layer is grown, in whole or in part, via a lateral epitaxial overgrowth or sidewall lateral epitaxial overgrowth process that utilizes a mask;
a mask window geometry for the lateral epitaxial overgrowth or sidewall lateral epitaxial overgrowth process utilizes one or more of the electrically inactive areas of the compound semiconductor layer as windows or protrusions for sidewall growth, respectively;
the mask window geometry for the lateral epitaxial overgrowth or sidewall lateral epitaxial overgrowth process is selected to yield an average threading dislocation density in the light emitting areas of less than approximately $1 \times 10^9$ cm$^{-2}$;
a lateral growth rate of the laterally overgrown compound semiconductor layer is not equal in all in-plane directions;
the lateral growth rate in each in-plane direction is selected such that coalescence of the laterally overgrown compound semiconductor layer occurs in one or more of the electrically inactive areas of the compound semiconductor layer;
the one or more of the electrically inactive areas of the compound semiconductor layer is removed;
light emitting layers are grown upon the laterally overgrown compound semiconductor layer; and
the light emitting areas are formed from the light emitting layers.

40. A method of forming an emissive imager device surrounded by streets, the emissive imager device consisting of an array of light emitting areas separated by electrically inactive areas formed on a laterally overgrown compound semiconductor layer wherein:
the compound semiconductor layer consists of gallium nitride, aluminum nitride, indium nitride, gallium arsenide, gallium phosphide, aluminum arsenide, indium phosphide, indium arsenide, or alloys thereof;
the laterally overgrown compound semiconductor layer is grown, in whole or in part, via a lateral epitaxial overgrowth or sidewall lateral epitaxial overgrowth process that utilizes a mask;
a mask window geometry for the lateral epitaxial overgrowth or sidewall lateral epitaxial overgrowth process utilizes one or more of the electrically inactive areas of the compound semiconductor layer as windows or protrusions for sidewall growth, respectively;
the mask window geometry for the lateral epitaxial overgrowth or sidewall lateral epitaxial overgrowth process is selected to yield an average threading dislocation density in the light emitting areas of less than approximately $1 \times 10^9$ cm$^{-2}$;
the mask window geometry is patterned such that every second electrically inactive area is not exposed through the windows in the mask material, such that coalescence of the laterally overgrown compound semiconductor layer occurs in one or more of the electrically inactive areas;
the one or more of the electrically inactive areas of the compound semiconductor layer is removed; light emitting layers are grown upon the laterally overgrown compound semiconductor layer; and
the light emitting areas are formed from the light emitting layers.

* * * * *